United States Patent
Matsuda

(10) Patent No.: US 9,178,078 B2
(45) Date of Patent: Nov. 3, 2015

(54) NON-VOLATILE MEMORY DEVICE

(71) Applicant: KABUSHIKI KAISHA TOSHIBA, Tokyo (JP)

(72) Inventor: Toru Matsuda, Mike-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 14/194,777

(22) Filed: Mar. 2, 2014

(65) Prior Publication Data

US 2015/0035035 A1  Feb. 5, 2015

(30) Foreign Application Priority Data

Jul. 30, 2013 (JP) .................. 2013-157572

(51) Int. Cl.
H01L 29/792 (2006.01)
H01L 27/115 (2006.01)

(52) U.S. Cl.
CPC ........ *H01L 29/7926* (2013.01); *H01L 27/1157* (2013.01); *H01L 27/11582* (2013.01)

(58) Field of Classification Search
CPC .................. H01L 27/11578; H01L 27/11582
USPC ................................. 257/314, 324
See application file for complete search history.

(56) References Cited

U.S. PATENT DOCUMENTS

| 8,530,955 B2 | 9/2013 | Iino et al. |
| 8,692,311 B2 | 4/2014 | Shinohara et al. |
| 2010/0109072 A1* | 5/2010 | Kidoh et al. ............ 257/324 |
| 2011/0175159 A1* | 7/2011 | Itagaki et al. ........... 257/326 |
| 2012/0184078 A1 | 7/2012 | Kiyotoshi |
| 2012/0241842 A1* | 9/2012 | Matsuda ................. 257/324 |
| 2012/0241844 A1 | 9/2012 | Iguchi et al. |

FOREIGN PATENT DOCUMENTS

JP   2012-204437   10/2012

* cited by examiner

*Primary Examiner* — Jamie C Niesz
(74) *Attorney, Agent, or Firm* — Patterson & Sheridan, LLP

(57) ABSTRACT

According to one embodiment, a non-volatile memory device includes a base layer, a first stacked unit and a second stacked unit disposed above the base layer and arranged in parallel to each other and spaced apart from each other in a first direction, in a plane parallel to the base layer, a first semiconductor layer penetrating the first stacked unit, a second semiconductor layer penetrating in the second stacked unit, the first memory film disposed between the first semiconductor layer and the first stacked unit, and a connecting portion disposed between the base layer and the first stacked unit and between the base layer and the second stacked unit and electrically connecting the first semiconductor layer and the second semiconductor layer. An end portion of the first semiconductor layer is positioned between the connecting portion and the base layer.

15 Claims, 25 Drawing Sheets

NON-VOLATILE MEMORY DEVICE

CROSS-REFERENCE TO RELATED APPLICATION

This application is based upon and claims the benefit of priority from Japanese Patent Application No. 2013-157572, filed Jul. 30, 2013, the entire contents of which are incorporated herein by reference.

FIELD

Embodiments described herein relate to a non-volatile memory device.

BACKGROUND

A non-volatile memory device, such as an NAND-type flash memory, is manufactured using semiconductor device manufacturing processes. Enlarging the capacity, reducing the power consumption, and reducing the cost of the non-volatile memory device are achieved by employing known miniaturization technology utilized in semiconductor device manufacturing. On the other hand, development of a memory cell array having a three-dimensional structure is necessary for further enlargement of the capacity of the non-volatile memory device. However, where a three dimensional memory cell array is formed, operation of the memory cell array may become unstable when the degree of miniaturization of the memory cell array is increased.

DETAILED DESCRIPTION

Figure 1:
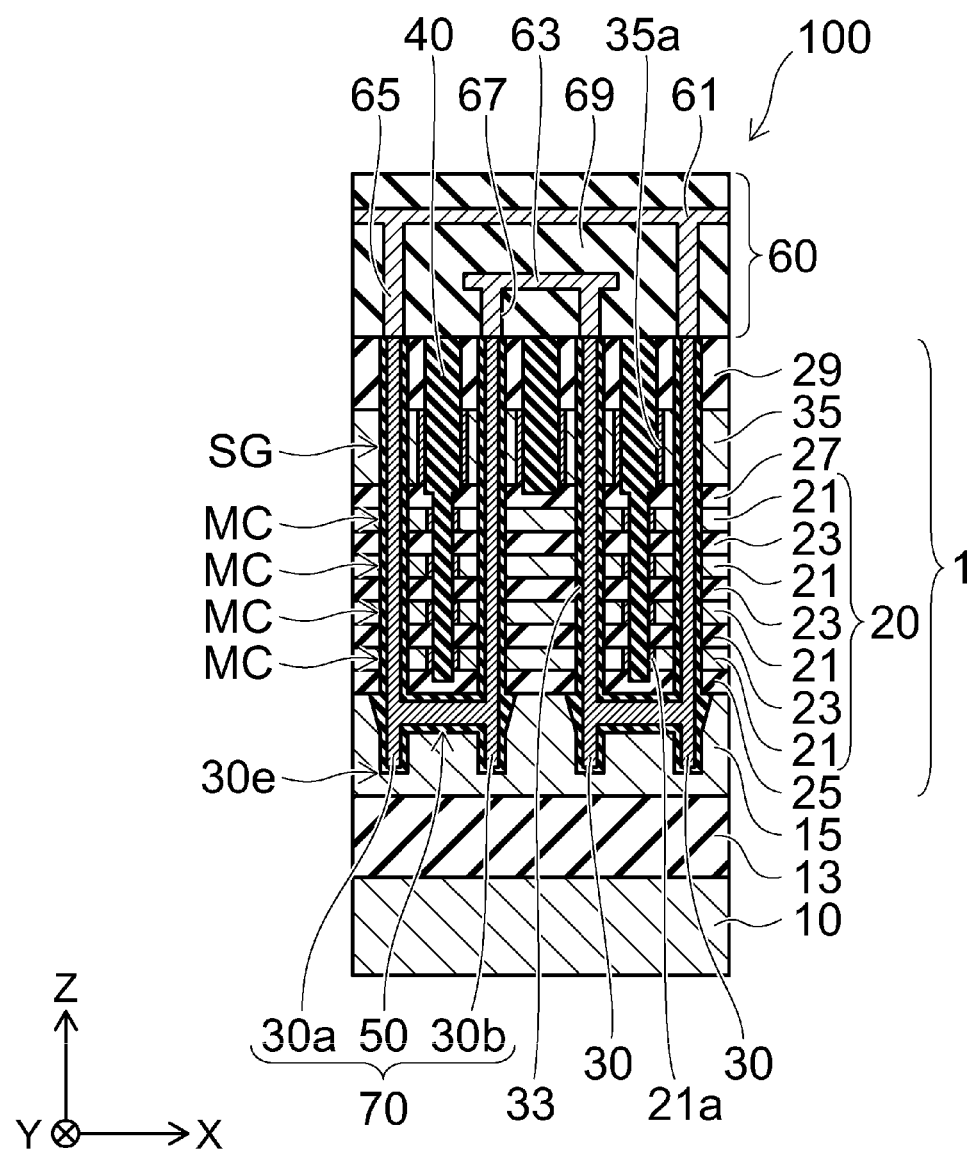
FIG. 1 is a cross-sectional view schematically illustrating a non-volatile memory device according to a first embodiment.

In general, according to one embodiment, there is provided a non-volatile memory device with a three dimensional memory cell array having enhanced operational stability and reliability.

According to one embodiment, a non-volatile memory device includes: a base layer; a first stacked unit and a second stacked unit disposed above the base layer and arranged in parallel to each other and spaced apart from each other in a first direction, in a plane parallel to the base layer, each of the first stacked unit and the second stacked unit including a plurality of electrodes stacked above the base layer and extending in a second direction perpendicular to the first direction; a first semiconductor layer penetrating the first stacked unit in a third direction perpendicular to the first direction and the second direction; a second semiconductor layer penetrating the second stacked unit in the third direction; a first memory film disposed between the first semiconductor layer and the first stacked unit; a second memory film disposed between the second semiconductor layer and the second stacked unit; an insulator disposed between the first stacked unit and the second stacked unit; and a connecting portion disposed between the base layer and the first stacked unit and between the base layer and the second stacked unit, the connecting portion electrically connecting the first semiconductor layer and the second semiconductor layer. An end portion of the first semiconductor layer is positioned between the connecting portion and the base layer.

Exemplary embodiments are hereinafter described with reference to the drawings. Similar elements in the drawings are given similar reference numbers in the respective figures, and a detailed explanation is not repeated for brevity unless the elements are different. The respective figures are only schematic or conceptual illustrations, and the relationships between the thicknesses and widths of the respective parts, the ratios of the sizes of the respective parts, and other conditions illustrated in the figures are not necessarily to scale. In addition, the sizes and ratios of some parts shown in one figure may be different from those of the corresponding parts shown in other figures.

First Embodiment

FIG. 1 is a cross-sectional view schematically illustrating a non-volatile memory device 100 according to a first embodiment.

Figure 2:
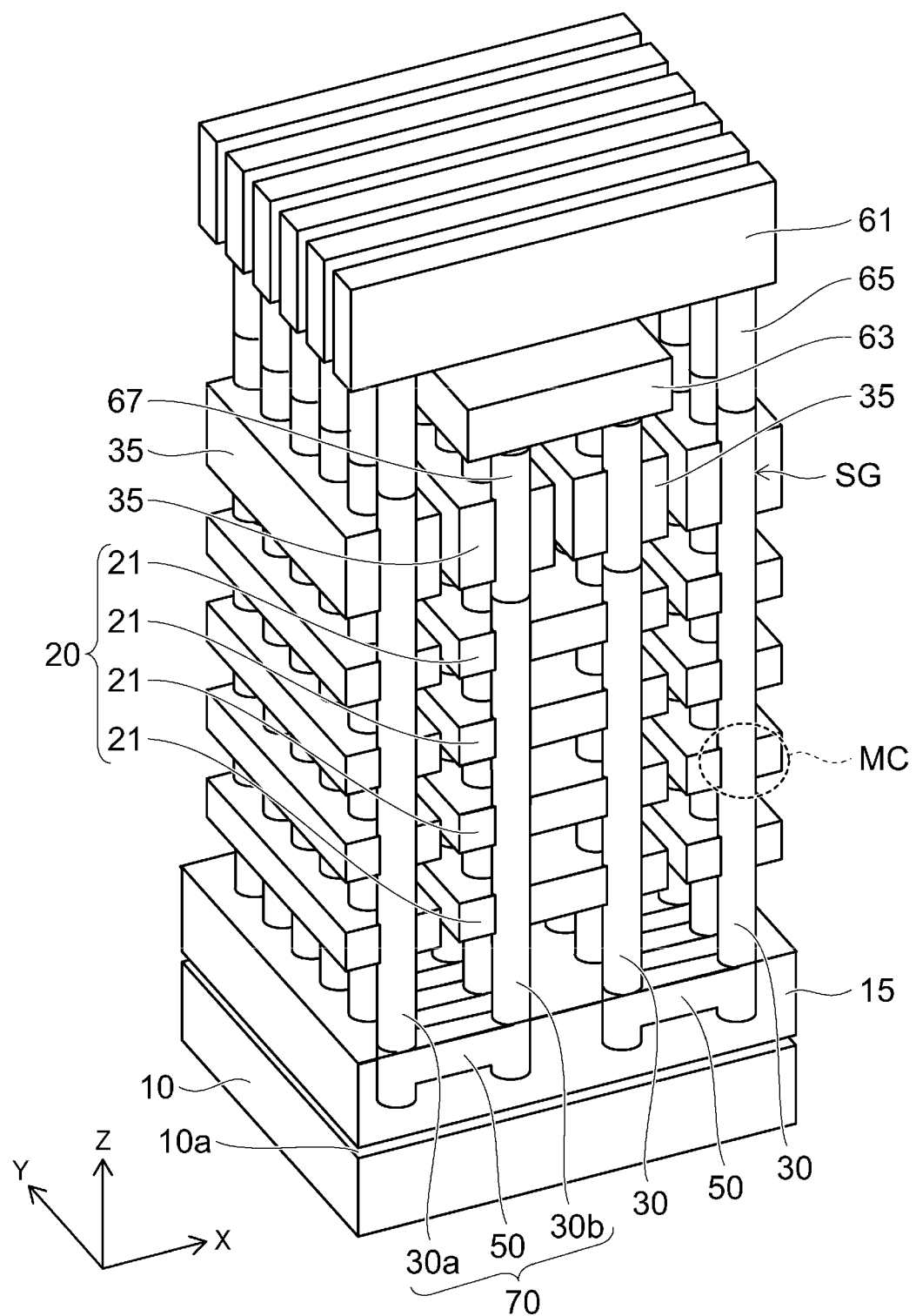
FIG. 2 is a perspective view schematically illustrating the non-volatile memory device according to the first embodiment.

FIG. 2 is a perspective view schematically illustrating the non-volatile memory device 100 according to the first embodiment. The non-volatile memory device 100 is an NAND-type flash memory, for example, and has a memory cell array 1 having three-dimensional constitution.

In the following description, the positions and shapes of the respective constituent elements are shown by using an X direction (first direction), a Y direction (second direction), and a Z direction (third direction) indicated in FIGS. 1 and 2. The Z direction is perpendicular to an X-Y plane containing the X direction and the Y direction. It is assumed in some portions of the following explanation that the Z direction and the –Z direction opposite to the Z direction correspond to the upward direction and the downward direction, respectively.

FIG. 1 illustrates a cross section of the memory cell array 1 crossing word lines at right angles. As illustrated in this figure, the memory cell array 1 includes a conductive layer 15 provided on a base layer (such as a substrate 10), and a plurality of laminated (stacked) electrodes 20 provided on the conductive layer 15.

As illustrated in FIG. 2, the plural laminated electrodes 20 are arranged such that they are located and spaced in parallel in the X direction within the X-Y plane generally parallel to the base layer. Each of the plural spaced electrodes 20 extend in the Y direction perpendicular to the x direction.

The base layer (hereinafter referred to as the substrate 10) is a silicon substrate, for example. The conductive layer 15 is provided on the substrate 10 via an interlayer insulation film 13 therebetween, for example. The substrate 10 may include a peripheral circuit for driving the memory cell array 1, for example.

Each of the laminated electrodes 20 includes a plurality of electrode layers (hereinafter referred to as word lines 21) laminated in the Z direction, and insulation layers 23 provided between the respective word lines 21. An insulator 40 is provided between each adjoining pair of the plural laminated electrodes 20. An end 21a of each of the word lines 21 contains a silicide formed on a adjacent portion of the word lines 21 contacting the insulator 40.

The memory cell array 1 further includes a plurality of conductive semiconductor layers 30, memory films 33, and conductive connecting portions 50. The plural semiconductor layers 30 penetrate each of the plural laminated electrodes 20 in the Z direction. The memory films 33 are provided between the plural semiconductor layers 30 and the laminated electrodes 20. Connecting portions 50 are provided between the substrate 10 and the laminated electrodes 20, and electrically connect one (a semiconductor layer 30a) of the plural semiconductor layers 30 penetrating one of the corresponding adjoining pair of the laminated electrodes 20 with one (a semiconductor layer 30b) of the plural semiconductor layers 30 penetrating the other of the corresponding adjoining pair of the laminated electrodes 20. The semiconductor layers 30 on the base layer side extend, with the memory film providing isolation thereof, inwardly of a conductive layer 25 and terminate at a location between the connecting portions 50 and the base layer.

In the following description, expressions of the "semiconductor layer 30a" and the "semiconductor layer 30b" are used in some cases for clarifying a distinction therebetween where each extends through an adjacent stack of laminated electrodes and are interconnected at connecting portions 50, and a collective expression of the "semiconductor layers 30" is used in other cases for expressing the semiconductor layer 30a and the semiconductor layer 30b collectively. Expressions in similar manners are used for other constituent elements as well.

Each of the memory films 33 is a multilayer film including a silicon oxide film and a silicon nitride film. The memory films 33 retain a charge introduced therein from the semiconductor layers 30, for example. The memory films 33 form memory cells MC in the portion thereof extending between the word lines 21 and the semiconductor layers 30. The plural memory cells MC are provided on each of the semiconductor layers 30 and extend in the same direction as the corresponding semiconductor layer 30.

The memory cell array 1 further includes control electrodes (hereinafter referred to as selector gate electrodes 35) provided on the laminated electrodes 20. The selector gate electrodes 35 surround the semiconductor layers 30 with the memory films 33 disposed therebetween, for example. The selector gate electrodes 35 control on-off (switching) of the plural semiconductor layers 30 for each layer. In other words, the memory films 33 function as gate insulation films for selection transistors SG formed at each memory cell.

A wiring layer 60 overlies the memory cell array 1. The wiring layer 60 includes a bit line 61 (first wire) and a source line 63 (second wire). The bit line 61 is electrically connected, by a contact plug extending therefrom, with the semiconductor layer 30a penetrating one of the adjoining pair of the laminated electrodes 20 with a. The source line 63 is electrically connected, through contact plug 67, with the semiconductor layer 30b penetrating the other of the adjoining pair of the laminated electrodes.

Accordingly, the semiconductor layers 30a and 30b constitute a NAND type memory cell string 70 electrically connected via the connecting portion 50. The NAND string 70 includes the plural memory cells MC provided on each of the semiconductor layers 30a and 30b, and the selection transistors SG provided on both sides of the plural memory cells MC. The memory cell array 1 has three-dimensional structure including the plural NAND strings 70 disposed in parallel in both of the X direction and the Y direction.

A manufacturing method of the non-volatile memory device 100 is now explained with reference to FIGS. 3A through 8B. FIGS. 3A through 8B are cross-sectional views schematically illustrating the manufacturing steps of the non-volatile memory device 100 according to the first embodiment. In the following explanation, the substrate 10 in the manufacturing process of the memory cell is called a "wafer" as well.

Figure 3A:
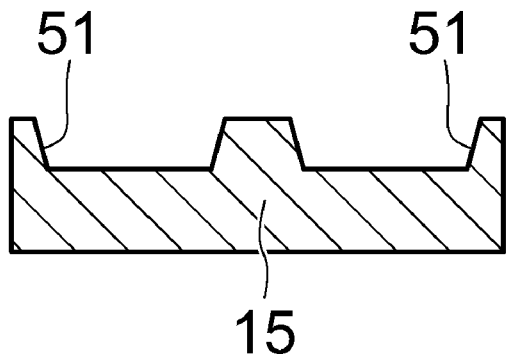
FIGS. 3A through 3C are cross-sectional views schematically illustrating manufacturing steps of the non-volatile memory device according to the first embodiment.

As illustrated in FIG. 3A, grooves 51 are formed in the conductive layer 15 provided on the interlayer insulation film 13 (see FIG. 1) on the substrate 10. More specifically, to form the grooves, an etching mask (not shown) is formed on the conductive layer 15 by photolithographic techniques, for example. Then, selective etching is executed on the conductive layer 15 to form the grooves 51 having a depth corresponding to the thickness of the connecting portion 50 and memory film layers 33. The conductive layer 15 is polycrystalline silicon, for example.

Figure 3B:
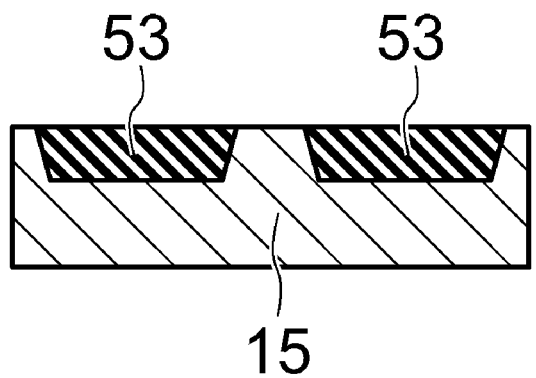

After the step of FIG. 3A, sacrificial films 53 are embedded in the grooves 51 as illustrated in FIG. 3B. For example, a silicon nitride film having a thickness larger than the depth of the grooves 51 is formed on the conductive layer 15. Then, the silicon nitride film is etched back to produce an exposed area of the conductive layer 15 between the adjoining grooves 51. As a result, the silicon nitride films (sacrificial films 53) inside the grooves 51 are produced.

Figure 3C:
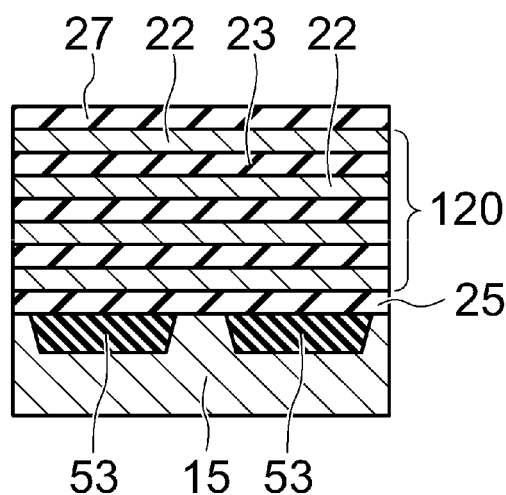

Thereafter, an insulation layer 25, a laminated body 120, and an insulation layer 27 are formed on the conductive layer 15 and the sacrificial films 53 in that order, the result as illustrated in FIG. 3C. The laminated body 120 includes conductive layers 22 and insulation layers 23 alternately laminated (stacked) on the insulation layer 25. According to this example, for purposes of clarity of illustration, the number of the stacked conductive layers 22 is four. However, preferably the number of conductive layers 22 is a larger number.

The conductive layers 22 are polycrystalline silicon layers, for example. The insulation layers 23 are formed as silicon oxide films, for example. Each of the insulation layers 23 is so formed to have a thickness sufficient for maintaining a withstand (breakdown) voltage between the adjoining conductive layers 22 when a voltage is applied between the adjoining conductive layers 22, and also sufficient to significantly ameliorate any induced cross talk therebetween. The insulation layer 25 is so formed as to have a thickness sufficient for maintaining the withstand voltage and preventing cross talk between the connecting portion 50 and the laminated electrodes 20. The insulation layer 25 may also function as a barrier layer in the etching process for the conductive layers 22 and the insulation layers 23.

The insulation layer 25 is made of material that provides selective etching with respect to the conductive layers 22 and the insulation layers 23. More specifically, in the etching process for the conductive layers 22 and the insulation layers 23, the etching rate of the insulation layer 25 is less than the etching rate of the conductive layers 22 and the etching rate of the insulation layers 23, or the insulation layer 25 is not etched during the etching of the layers 22 and 23. The insulation layer 25 is preferably made of metal oxide such as tantalum oxide.

The insulation layer 27 includes a silicon oxide film, for example, and is formed as to have a thickness sufficient for maintaining a withstand (breakdown) voltage and preventing cross talk between the selector gate electrodes 35 provided on the insulation layer 27 and the laminated electrodes 20 when a voltage is applied therebetween.

Figure 4A:
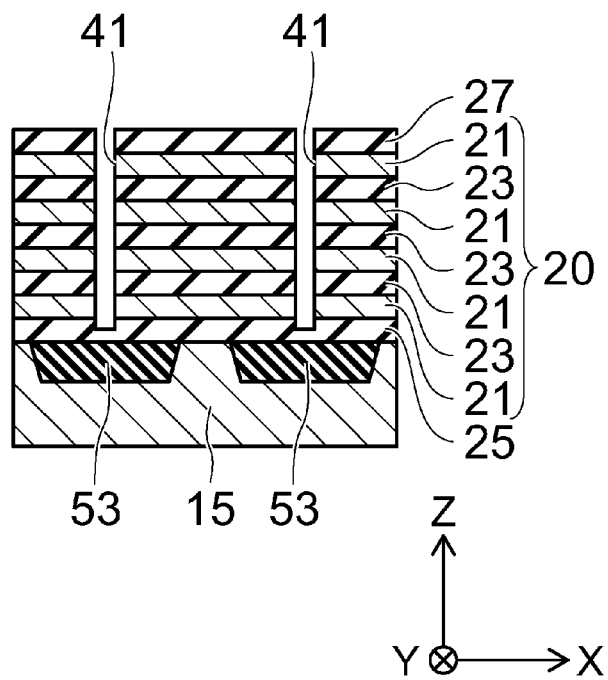
FIGS. 4A and 4B are cross-sectional views schematically illustrating manufacturing steps continuing from FIG. 3C.

After the step of forming the structure shown in FIG. 3C, grooves (hereinafter referred to as slits 41) are formed immediately above the sacrificial films 53 to divide the conductive layers 22 into isolated parts as illustrated in FIG. 4A. The slits 41 extend in the Y direction, and divide the conductive layers 22 into the word lines 21 in the shape of stripes, for example.

Each of the slits 41 has a depth extending from the upper surface of the insulation layer 27 to the insulation layer 25. According to this structure, the insulation layer 25 functions as a barrier layer at which etching of the slits 41 stops above the slits 41.

Figure 4B:
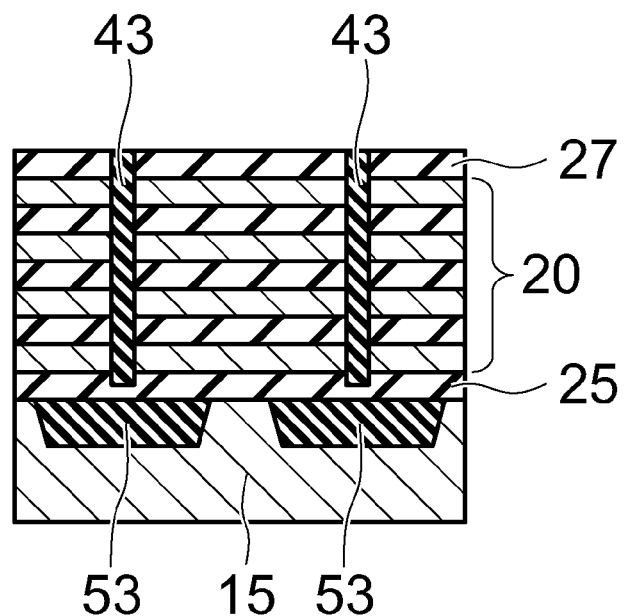

After the structure shown in FIG. 4A is formed, sacrificial films 43 are formed inside the slits 41 as illustrated in FIG. 4B. The sacrificial films 43 are silicon nitride films, for example. In this case, a silicon nitride film filling the interiors of the slits 41 and covering the upper surface of the insulation layer 27 is formed, for example. Then, the silicon nitride film is etched back to remove the silicon nitride film formed on the insulation layer 27 leaving in place the portion thereof embedded in the slits 41.

After the structure as shown in FIG. 4B is completed, a conductive layer 34 and an insulation layer 29 are formed on the insulation layer 27. The conductive layer 34 is a polycrystalline silicon layer, for example. The insulation layer 29 is formed on the conductive layer 34 to protect the conductive layer 34. The insulation layer 29 includes a silicon oxide film, for example.

Figure 5A:
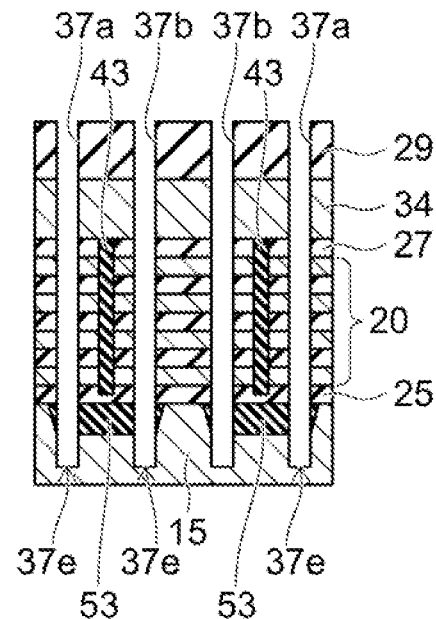
FIGS. 5A and 5B are cross-sectional views schematically illustrating manufacturing steps continuing from FIG. 4B.
Figure 5B:
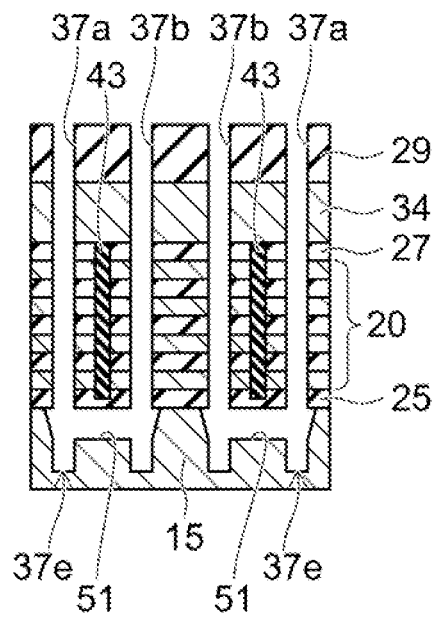

Then, memory holes 37a and 37b having a depth extending from the upper surface of the insulation layer 29 and into the conductive layer 15 as are shown in FIG. 5B, are formed by etching. Ends 37e of the memory holes 37a and 37b on the lower side (closest to the substrate 10 of FIGS. 1 and 2) are located within conductive layer 15 at a position between the substrate 10 and the sacrificial films 53 (see FIG. 1). For example, the memory holes 37a and 37b penetrate the insulation layer 25 and the sacrificial films 53 and reach into the conductive layer 15. The memory holes 37a and 37b may be so formed as to have a sufficient depth for penetrating the conductive layer 15 and reach the interlayer insulation film 13.

After the structure of FIG. 5A is formed, the sacrificial films 53 are etched away through the memory holes 37a and 37b to reproduce the grooves 51 connecting the memory holes 37a and the memory holes 37b as illustrated in FIG. 5B.

Figure 6A:
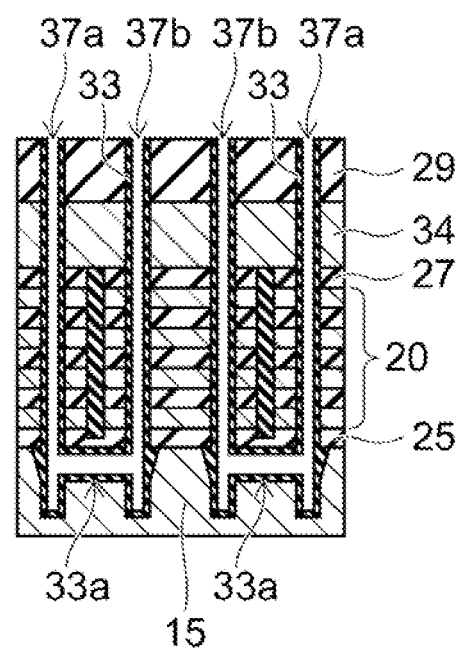
FIGS. 6A and 6B are cross-sectional views schematically illustrating manufacturing steps continuing from FIG. 5B.

After the structure of FIG. 5B is formed, the memory films 33 are formed on the inner surfaces of the memory holes 37a, the inner surfaces of the memory holes 37b, and the inner surfaces of the grooves 51 as illustrated in FIG. 6A. The memory films 33 are produced by using CVD (chemical vapor deposition), for example. Each of the memory films 33 includes a block film, a charge film, and a gate oxide film in this order from the side of the word line 21 (see FIG. 1), for example from the outside to the inside thereof. The block film includes an insulating metal oxide film. The charge film is a silicon nitride film, for example. The gate film is a silicon oxide film, for example.

Figure 6B:
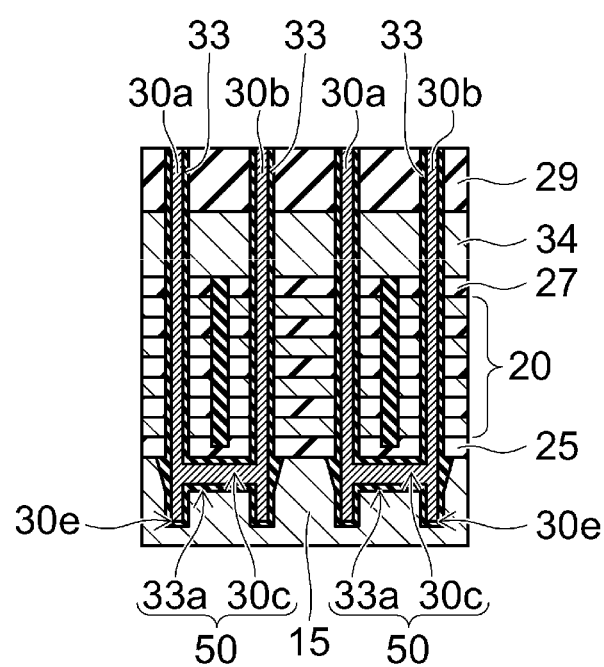

After the step in FIG. 6A, the semiconductor layers 30 are formed on the memory films 33 as illustrated in FIG. 6B. The semiconductor layers 30a and 30b are formed on the inner surfaces of the memory holes 37a and 37b, respectively. The semiconductor layers 30a and 30b may completely fill the interiors of the memory holes 37a and 37b, or the semiconductor layers 30a and 30b may encapsulate a hollow structure or a cavity therein.

Cores 30c of the connecting portions 50 are formed on the inner surfaces of the grooves 51. Each of the connecting portions 50 has the core 30c, and an insulation film (hereinafter referred to as a memory film 33a) covering the core 30c, for example. The core 30c is a polycrystalline silicon layer formed simultaneously with formation of the semiconductor layers 30a and 30b, and which electrically connects the semiconductor layer 30a and the semiconductor layer 30b. The core 30c may be structured as to completely fill the interior of the groove 51, or may encapsulate a hollow structure or a cavity therein.

According to this example, the memory film 33a covering the core 30c is a part of the memory film 33, and contains the same material as that of the memory film 33. The memory film 33a is so formed as to have a sufficient thickness for functioning as a gate insulation film, for example. The portions of the conductive layer 15 facing the core 30c via the memory film 33a functions as a back gate. More specifically, an accumulation channel formed at the interface between the memory film 33a and the core 30c when a voltage is applied to the conductive layer 15 reduces the resistance of the connecting portion 50.

Figure 7A:
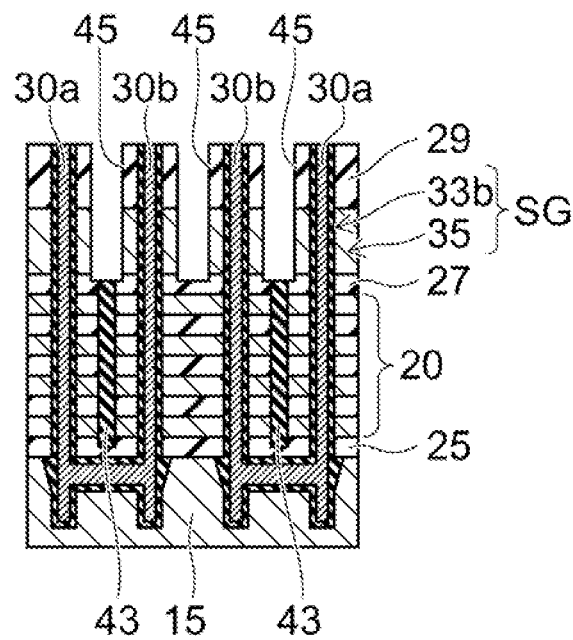
FIGS. 7A and 7B are cross-sectional views schematically illustrating manufacturing steps continuing from FIG. 6B.

After the structure shown in FIG. 6B is completed, grooves 45 are formed to divide the conductive layer 34 formed on the laminated electrodes 20 into isolated parts as illustrated in FIG. 7A. The grooves 45 extend in the Y direction (into the page) and divide the conductive layer 34 into the selector gate electrodes 35 (see FIG. 2) in the shape of stripes. The grooves 45 are formed between the semiconductor layers 30a and the semiconductor layers 30b, and between the adjoining semiconductor layers 30b. The grooves 45 communicate with the sacrificial films 43 in the spaces between the semiconductor layers 30a and the semiconductor layers 30b.

Figure 7B:
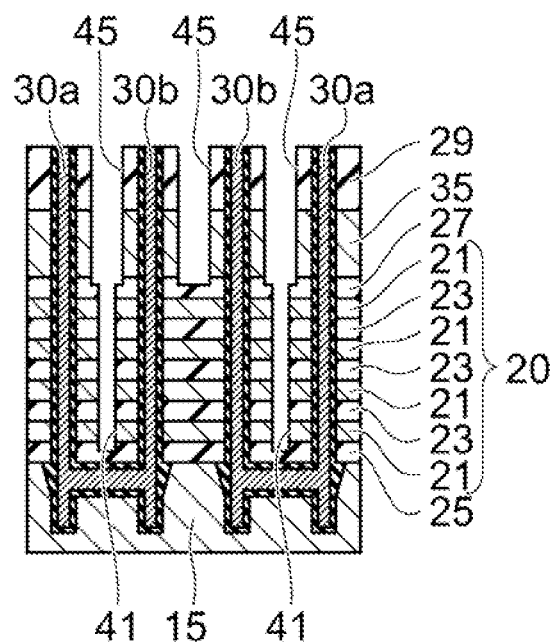

After the structure shown in FIG. 7A are formed, the sacrificial films 43 are selectively removed through the grooves 45 to reproduce the slits 41 as illustrated in FIG. 7B. The sacrificial films 43 are silicon nitride films, for example, and made of material allowing selective etching with respect to the word lines 21 and the selector gate electrodes 35 containing polycrystalline silicon, the insulation layers 23, 27, and 29 including silicon oxide films, and the insulation layer 25 as a barrier layer. More specifically, the etching rate of the sacrificial films 43 is higher than that of other parts of the structure. Alternatively, such conditions which allow etching of the sacrificial films 43 and not allow etching of other parts of the structure may be adopted.

Figure 8A:
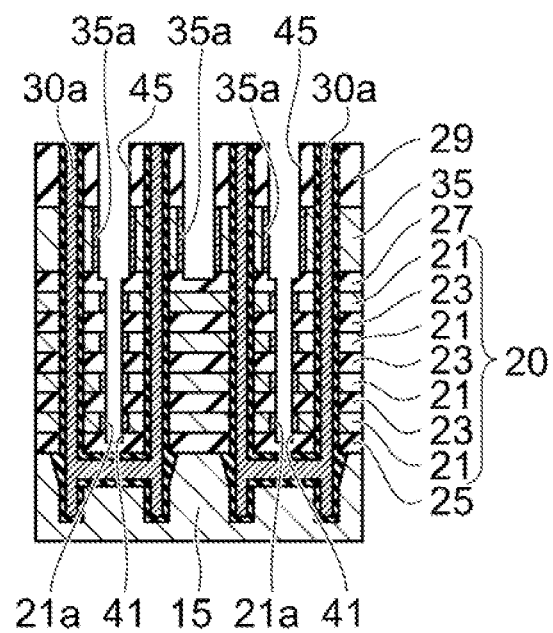
FIGS. 8A and 8B are cross-sectional views schematically illustrating manufacturing steps continuing from FIG. 7B.

After the structure shown in FIG. 7B is formed, ends 35a of the selector gate electrodes 35 exposed to the inner surfaces of the grooves 45, and the ends 21a of the word lines 21 exposed to the inner surfaces of the slits 41 are silicided, as illustrated in FIG. 8A. For example, metal films such as nickel (Ni) films and cobalt (Co) films are formed on the inner surfaces of the grooves 45 and the inner surfaces of the slits 41 by using CVD. Then, the structure shown in FIG. 8A is heated to convert the ends 35a of the selector gate electrodes 35 and the ends 21a of the word lines 21 into a silicide. Subsequently, any metal film formed at the ends of the insulation layers 27 and 29 exposed to the inner surfaces of the grooves 45 and the insulation layers 23 and 25 exposed to the inner surfaces of the slits 41 are removed.

Figure 8B:
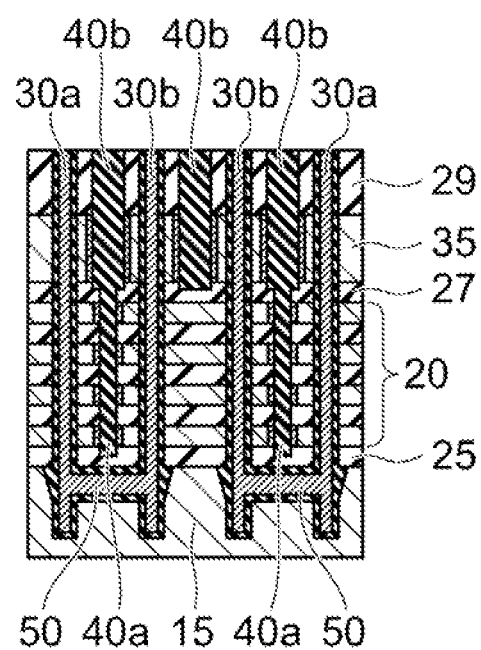

After forming the structure shown in FIG. 8A, the insulators 40 are formed inside the slits 41 and the grooves 45 as illustrated in FIG. 8B. The insulators 40 include parts 40a filling the interiors of the slits 41, and parts 40b filling the grooves 45.

The insulators 40 are formed as silicon oxide films produced by the CVD method, for example. In this case, a silicon oxide film is formed on the wafer having the word lines 21 and the selector gate electrodes 35, the ends of which components 21 and 35 are made converted to a silicide, for example. Then, the silicon oxide film is etched back in the area other than the parts filling the slits 41 and the grooves 45 to produce the insulators 40.

Accordingly, the ends 21a of the word lines 21 including the insulators 40, and the ends 35a of the selector gate electrodes 35 contacting the insulators 40 contain a silicide, wherefore the electrical resistance at these ends is decreased.

Then, the wiring layer 60 is formed on the insulation layer 29 to complete the non-volatile memory device 100. The wiring layer 60 is a multilayer wiring including the bit line 61, the source line 63, and an interlayer insulation film 69 (see FIG. 1).

According to this embodiment, the ends of the semiconductor layers 30 (30a and 30b) on the substrate 10 side of the stacked word lines 21 are so disposed as to extend to a position in the conductor layer 15 between the connecting portions 50 and the substrate 10 (see FIG. 1). This structure increases the surface area where the conductive layer 15 interfaces with the semiconductor layers 30 and the cores 30c via the insulation films (memory films 33), thereby stabilizing the operation of the conductive layer 15 when functioning as a back gate. Accordingly, the reliability of the memory cell array 1 improves.

Second Embodiment

Figure 9:
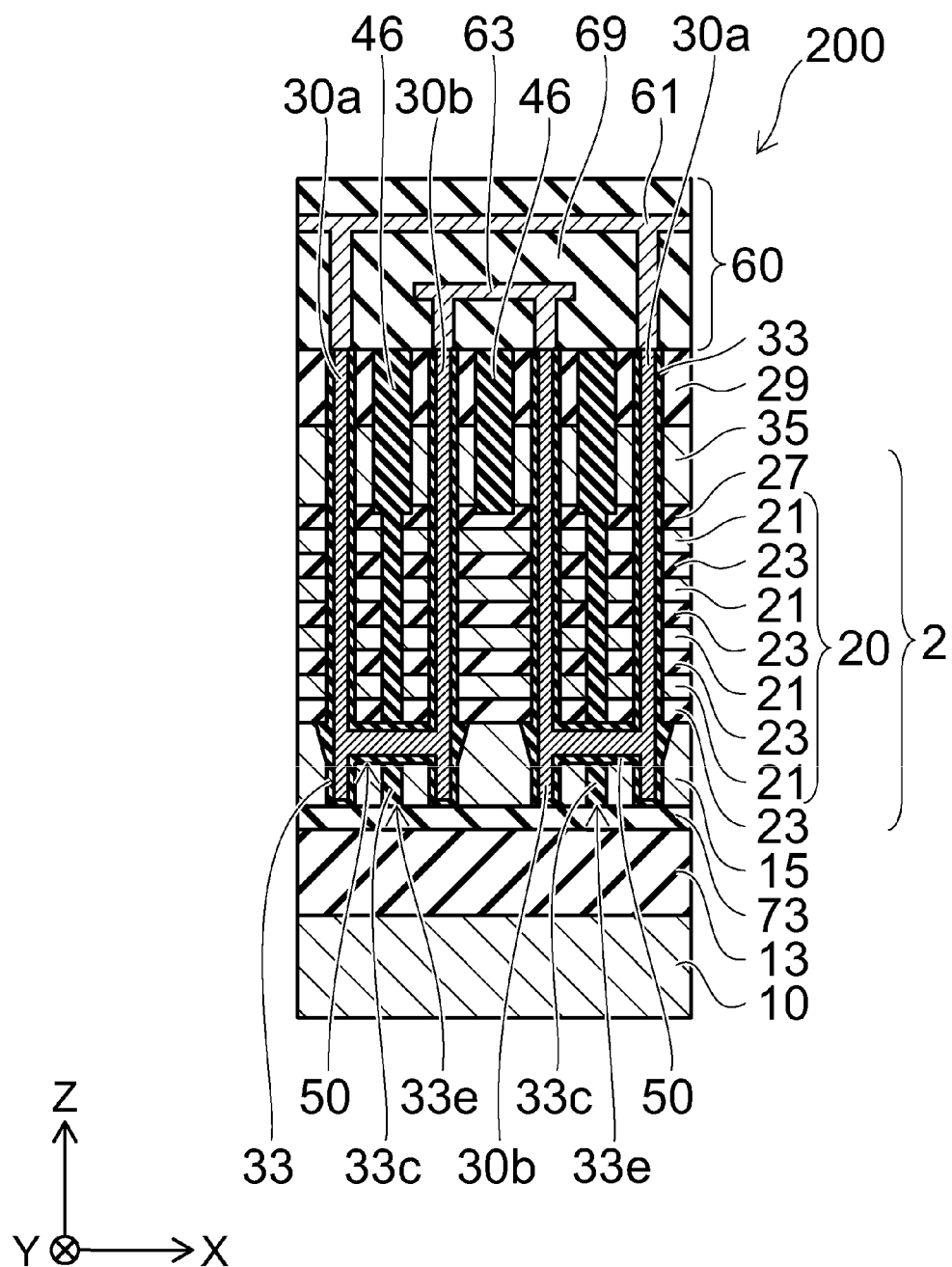
FIG. 9 is a cross-sectional view schematically illustrating a non-volatile memory device according to a second embodiment.

FIG. 9 is a cross-sectional view schematically illustrating a non-volatile memory device 200 according to a second embodiment. The non-volatile memory device 200 includes a memory cell array 2 having a three-dimensional structure. FIG. 9 shows a cross section of the memory array 2 crossing the word lines 21 at right angles.

As illustrated in FIG. 9, the memory cell array 2 includes the conductive layer 15 provided on a barrier layer disposed on the substrate 10, and the plural laminated electrodes 20 extending from the conductive layer 15. Each of the laminated electrodes 20 includes the plural word lines 21 laminated in the Z direction, and the insulation layers 23 disposed between the respective word lines 21.

The substrate 10 is a silicon substrate, for example. The conductive layer 15 may be provided on the substrate 10 via the interlayer insulation film 13 as shown in FIG. 1, for example. The substrate 10 may include a peripheral circuit for driving the memory cell array 2, for example.

The memory cell array 2 further includes the plural semiconductor layers 30, the memory films 33, insulators (memory films 33c), and the connecting portions 50.

The plural semiconductor layers 30 penetrate each of the plural laminated electrodes 20 in the Z direction. The memory films 33 are provided between each of the plural semiconductor layers 30 and the laminated electrodes 20. The memory films 33c are provided between adjoining pairs of the plural laminated electrodes 20. The connecting portions 50 are provided between the substrate 10 and the laminated electrodes 20. Each of the connecting portions 50 electrically connects one (semiconductor layer 30a) of the plural semiconductor layers 30 penetrating one of the corresponding adjoining pair of the laminated electrodes 20 with one (semiconductor layer 30b) of the plural semiconductor layers 30 penetrating the other of the corresponding adjoining pair of the laminated electrodes 20.

The ends of the semiconductor layers 30 on the substrate 10 side of the laminated electrodes 20 extend to a location between the connecting portions 50 and the substrate 10. In this case, the semiconductor layers 30 may be positioned such that the substrate side ends of the semiconductor layers 30 are located within the conductive layer 15, or the semiconductor layers 30 may penetrate the conductive layer 15.

Moreover, according to this embodiment, the ends of the memory films 33c on the substrate 10 side of the laminated electrodes 20 are also positioned between the connecting portions 50 and the substrate 10. In this case, the memory films 33c may be positioned such that the substrate side ends of the memory films 33c are located within the conductive layer 15, or that the memory films 33c partially divide the conductive layer 15 into parts as will be described herein with respect to FIG. 12B. The conductive layer 15 is connected with the peripheral parts of the memory cell array 2 into a one piece body to maintain the same potential as that of the peripheral parts.

In this embodiment there is no barrier layer as in the embodiment of FIG. 1 (insulation layer 25) interposed between the conductive layer 15 and the laminated electrodes 20. For example, the insulation layer 23 is provided between the conductive layer 15 and the laminated electrodes 20. According to this embodiment, it is preferable that a barrier layer 73 is provided between the conductive layer 15 and the substrate 10.

The barrier layer 73 allows selective etching with respect to the conductive layer 15. For example, the barrier layer 73 functions as an etch stop layer at the time of formation of the memory holes 37 and the slits 41. The barrier layer 73 may be formed by a metal oxide film, for example. The barrier layer 73 may be either a conductive layer or a non-conductive layer.

A manufacturing method of the non-volatile memory device 200 is now explained with reference to FIGS. 10A through 14B. FIGS. 10A through 14B are cross-sectional views schematically illustrating the manufacturing steps of the non-volatile memory device 200 according to the second embodiment.

Figure 10A:
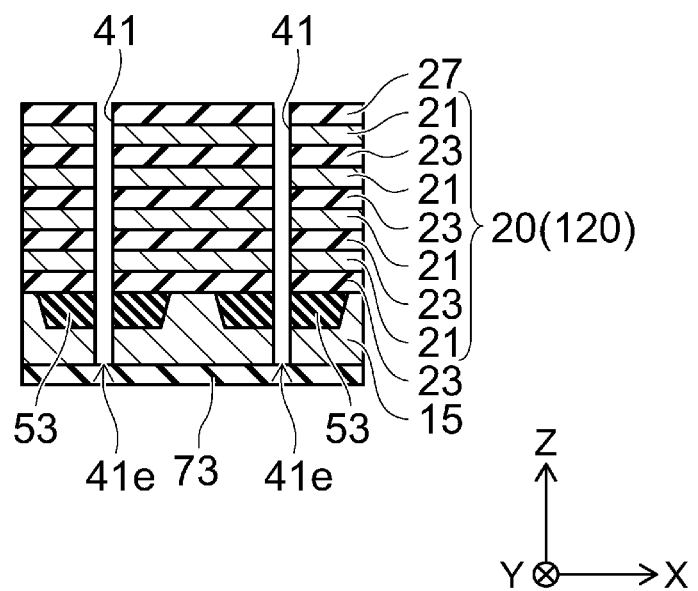
FIGS. 10A and 10B are cross-sectional views schematically illustrating manufacturing steps of the non-volatile memory device according to the second embodiment.

FIG. 10A schematically shows a cross section which includes a laminated body 120 divided by the slits 41, forming the laminated electrodes 20. According to this embodiment, the sacrificial films 53 are embedded in the conductive layer 15 in a manner similar to the manufacturing steps shown in FIGS. 3A through 3C of the first embodiment. Furthermore, the laminated body 120 and the insulation layer 27 are formed on the conductive layer 15 via the insulation layer 23. The barrier layer 73 is provided between the substrate 10 (not shown) and the conductive layer 15.

The slits 41 extend in the Y direction, and divide the laminated body 120 in the shape of strips. The slits 41 are so formed as to divide the sacrificial films 53, and are positioned that the ends of the slits 41 on the substrate side are located between the sacrificial films 53 and the barrier layer 73.

The slits 41 may be provided as to communicate with the barrier layer 73, for example. The barrier layer 73 allows selective etching, i.e., it is significantly unaffected by the chemistries used to etch the conductive layer 15, the sacrificial films 53, the insulation layer 23, the laminated body 120, and the insulation layer 27. In this case, the barrier layer 73 functions as an etch stop for the forming of the slits 41.

Figure 10B:
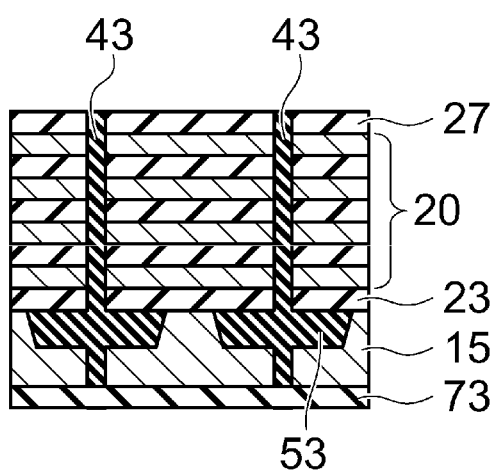

After the structure of FIG. 10A is formed, the sacrificial films 43 are formed inside the slits 41 as illustrated in FIG. 10B. The sacrificial films 43 are silicon nitride films, for example. In this case, a silicon nitride film filling the interiors of the slits 41 and covering the upper surface of the insulation layer 27 is formed on the wafer. Then, the silicon nitride film is etched back in the area other than the interior of the slits 41 to remove the silicon nitride film formed on the insulation layer 27.

After the structure shown in FIG. 10B is formed, the conductive layer 34 and the insulation layer 29 are formed on the insulation layer 27. The conductive layer 34 is a polycrystalline silicon layer, for example. The insulation layer 29 includes a silicon oxide film, for example.

Figure 11A:
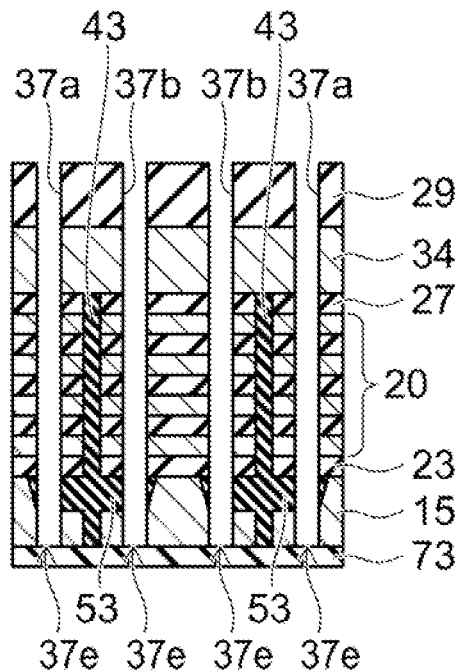
FIGS. 11A and 11B are cross-sectional views schematically illustrating manufacturing steps continuing from FIG. 10B.

Then, the memory holes 37a and 37b having a depth extending from the upper surface of the insulation layer 29 to the conductive layer 15 are formed as shown in FIG. 11A. The ends 37e of the memory holes 37a and 37b on the lower side (where the substrate 10 of FIG. 9 would be) are positioned between the barrier layer 73 and the sacrificial films 53. For example, the memory holes 37a and 37b penetrate the insulation layer 25 and the sacrificial films 53 and reach the conductive layer 15.

The memory holes 37a and 37b may communicate with the barrier layer 73. In this case, the barrier layer 73 functions as an etch stop layer and thereby reduces variation of the depth of the memory holes 37.

Figure 11B:
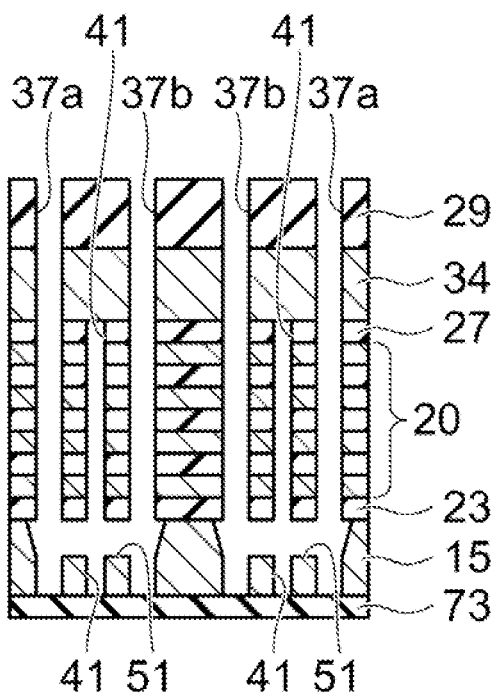

After the structure of FIG. 11A is formed, the sacrificial films 43 and 53 are etched away through the memory holes 37a and 37b as illustrated in FIG. 11B. This step reproduces the grooves 51 communicating the memory holes 37a with the memory holes 37b, and the slits 41.

Figure 12A:
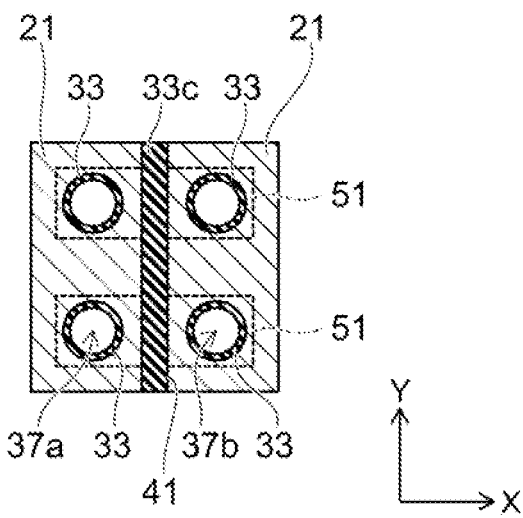
FIGS. 12A and 12B are cross-sectional views schematically illustrating manufacturing steps continuing from FIG. 11B.
Figure 12B:
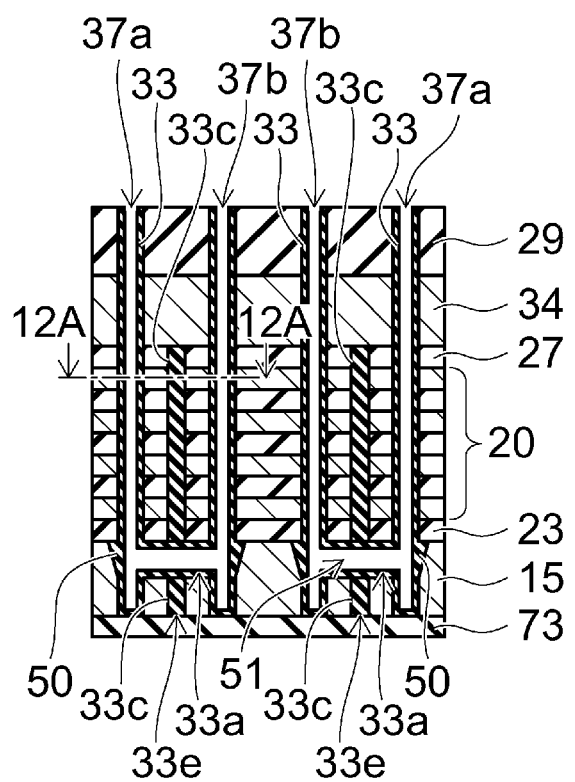

After the structure shown in FIG. 11B is formed, the memory films 33 are formed on the inner surfaces of the memory holes 37a, the inner surfaces of the memory holes 37b, the inner surfaces of the grooves 51, and in the interiors of the slits 41 as illustrated in FIGS. 12A and 12B.

FIG. 12A is a cross-sectional view taken along a line 12A-12A in FIG. 12B. FIG. 12B illustrates a cross section crossing the word lines 21 at right angles. These definitions of the figures are applicable to FIGS. 13A and 13B and FIGS. 14A and 14B.

As illustrated in FIG. 12A, the memory films 33 cover the respective inner surfaces of the memory holes 37a and 37b. The memory films 33 are provided to fill the interior surfaces of the slits 41. In this case, the width of each of the slits 41 in the X direction is less than or equal to twice as the film thickness of the memory film 33c formed inside the corresponding slit 41, for example.

As illustrated in FIG. 12B, the slits 41 formed between the grooves 51 and the barrier layer 73 are also filled by the memory films 33c. The lower ends 33e of the memory films 33c closing the slits 41 (on the substrate side) may contact the barrier layer 73, for example.

Figure 13A:
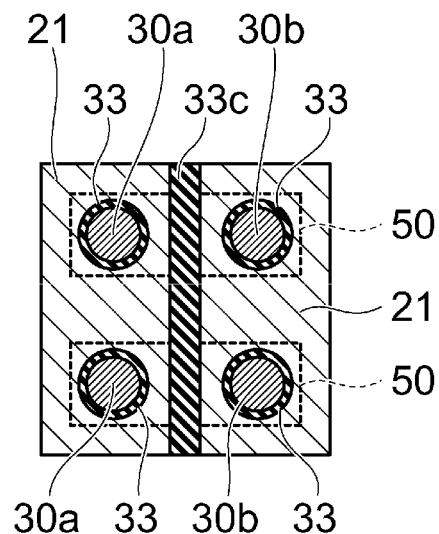
FIGS. 13A and 13B are cross-sectional views schematically illustrating manufacturing steps continuing from FIG. 12B.
Figure 13B:
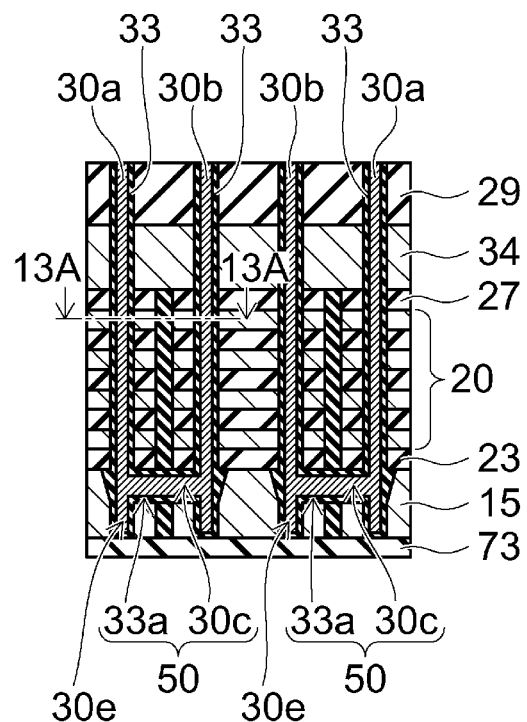

After the structures in FIGS. 12A and 12B are formed, the semiconductor layers 30 are formed on the memory films 33 as illustrated in FIGS. 13A and 13B. The semiconductor layers 30a and 30b are formed on the inner surfaces of the memory holes 37a and 37b, respectively. The semiconductor layers 30a and 30b may fill the interiors of the memory holes 37a and 37b, or may have encapsulated a hollow cavity therein.

The cores 30c of the connecting portions 50 are formed on the inner surfaces of the grooves 51. Each of the connecting portions 50 includes the core 30c, and the memory film 33a covering the core 30c, for example. The conductive layer 15 covers the lower surfaces and the side surfaces of the connecting portions 50.

The cores 30c are formed by polycrystalline silicon layers, for example, and produced simultaneously with the formation of the semiconductor layers 30a and 30b. The cores 30c electrically connect the semiconductor layers 30a with the semiconductor layers 30b. The cores 30c may have structure filling the interiors of the grooves 51, or encapsulate hollow cavities therein. On the other hand, the interiors of the slits 41 are filled by the memory films 33c and no semiconductor layer is formed therein.

The memory films 33 may contact the barrier layer 73 at the substrate side ends 30e of the semiconductor layers 30. In other words, the substrate side ends 30e of the semiconductor layers 30 may be positioned in the vicinity of the barrier layer 73 via the memory films 33.

Figure 14A:
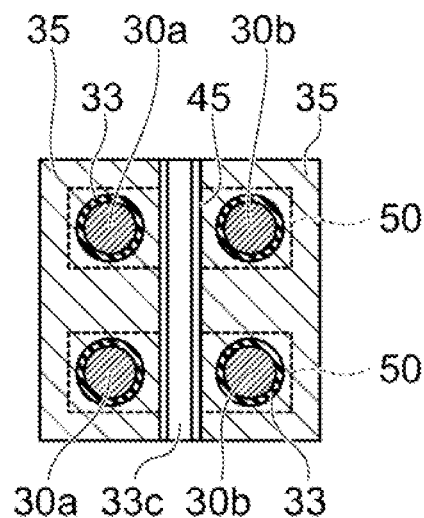
FIGS. 14A and 14B are cross-sectional views schematically illustrating manufacturing steps continuing from FIG. 13B.
Figure 14B:
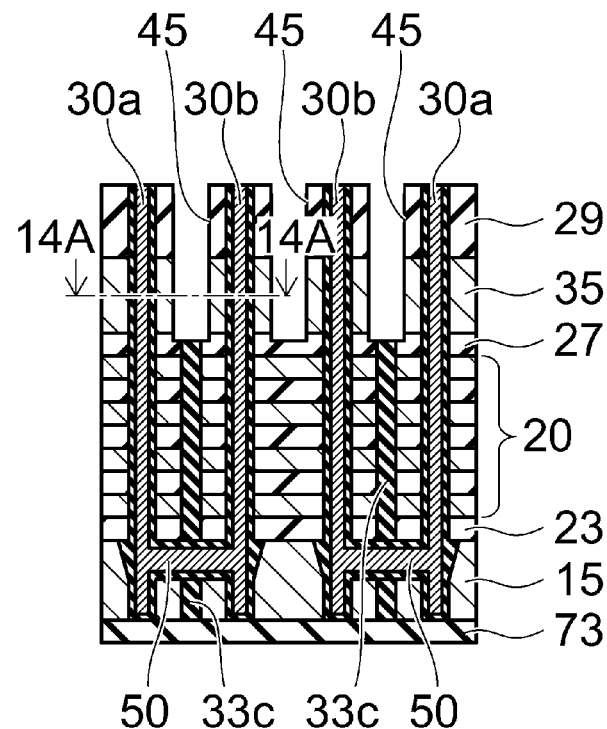

After the structure shown in FIGS. 13A and 13B is formed, the grooves 45 which divide the conductive layer 34 formed on the laminated electrodes 20 into parts are formed as illustrated in FIGS. 14A and 14B. The grooves 45 extend in the Y direction (into the page), and divide the conductive layer 34 into the selector gate electrodes 35 in the shape of stripes. The grooves 45 are formed between the semiconductor layers 30a and the semiconductor layers 30b, and between the adjoining semiconductor layers 30b. In this case, the grooves 45 communicate with the memory films 33c in the spaces between the semiconductor layers 30a and the semiconductor layers 30b.

Then, insulators 46 are formed inside the grooves 45 (shown in FIG. 9). The insulators 46 are silicon oxide films formed by CVD, for example. In this case, a silicon oxide film having a thickness sufficient for filling the grooves 45 is formed on the stacked body. Then, the silicon oxide film is etched back in the area other than the parts filling the grooves 45 to produce the insulators 46. Furthermore, the wiring layer 60 is formed on the insulation layer 29 to complete the non-volatile memory device 200 illustrated in FIG. 9.

According to this embodiment, no barrier layer is provided between the conductive layer 15 and the laminated electrodes 20. According to this structure, the memory holes 37 are easily formed in the area from the upper surface of the insulation layer 29 provided on the selector gate electrodes 35 to the conductive layer 15.

According to the example discussed in the first embodiment, the insulation layer 25 (barrier layer) is provided between the conductive layer 15 and the laminated electrodes 20. The insulation layer 25 allows selective etching with respect to the word lines 21 included in the laminated electrodes 20 and the insulation layers 23. In this case, etching of the insulation layer 25 required when through holes are formed in the process of manufacturing the memory holes 37 becomes more difficult. This condition produces variations in the sizes of the memory holes 37, wherefore the device characteristics may deteriorate.

On the other hand, when the barrier layer is not provided between the conductive layer 15 and the laminated electrodes 20, excessive progress of etching which divides the sacrificial films 53 along the slits 41 is difficult to stop in the process of dividing the conductive layers 22 and forming the word lines 21. In this case, the connecting portions 50 may be divided into parts by the insulators 40.

According to this embodiment, no barrier layer is provided between the conductive layer 15 and the laminated electrodes 20. In this case, the memory holes 37 are easily formed, and the memory holes 37 extending from the insulation layer 29 to the conductive layer 15 are produced in one step, for example. Moreover, the sacrificial films 43 filling the slits 41 are etched through the grooves 51 forming the connecting portions 50, and the insulators (memory films 33c) filling the slits 41 are formed through the grooves 51. In this case, the connecting portions 50 are not divided by the insulators, and the sizes of the memory holes 37 are equalized. Accordingly, the device characteristics of the non-volatile memory device 200 are improved.

Third Embodiment

Figure 15:
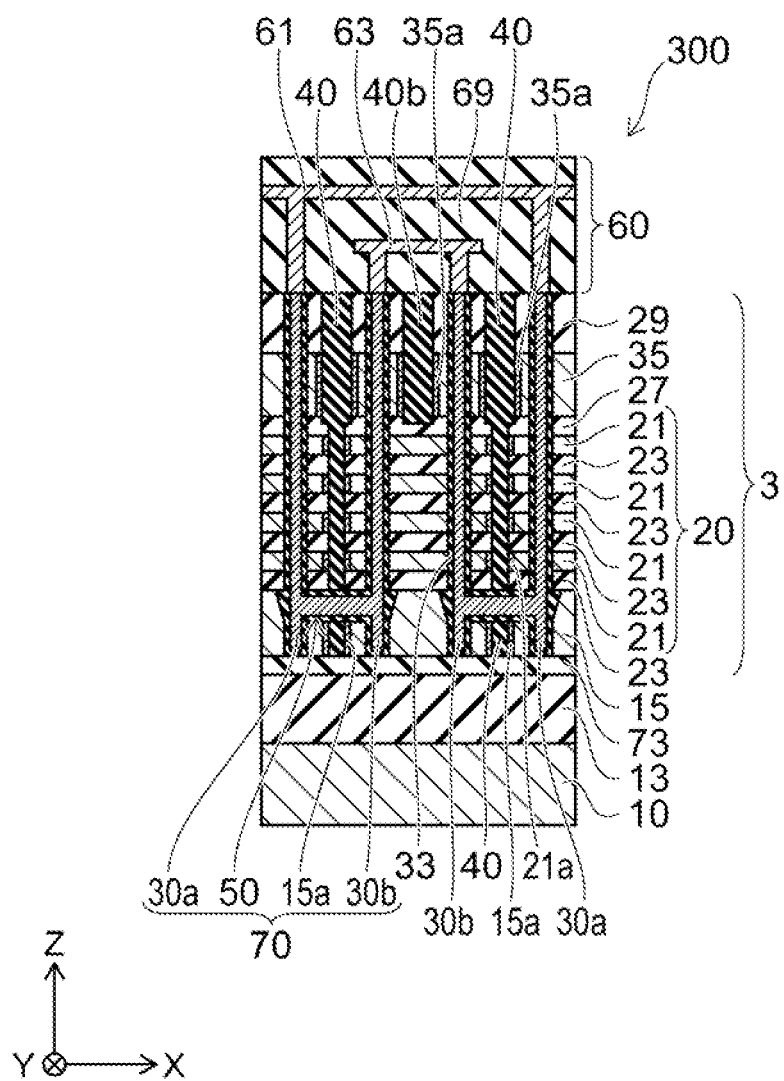
FIG. 15 is a cross-sectional view schematically illustrating a non-volatile memory device according to a third embodiment.

FIG. 15 is a cross-sectional view schematically illustrating a non-volatile memory device 300 according to a third embodiment. The non-volatile memory device 300 includes a memory cell array 3 having three-dimensional constitution. FIG. 15 shows a cross section of the memory cell array 3 crossing the word lines 21 at right angles.

As illustrated in FIG. 15, the memory cell array 3 includes the conductive layer 15 provided on the substrate 10 and the plural laminated electrodes 20 provided on the conductive layer 15. Each of the laminated electrodes 20 includes the plural word lines 21 laminated in the Z direction, and the insulation layers 23 provided between the respective word lines 21.

The substrate 10 is a silicon substrate, for example. The conductive layer 15 overlays the interlayer insulation film 13, which is provided on the substrate 10, for example. The substrate 10 may include a peripheral circuit for driving the memory cell array 3, for example.

The memory cell array 3 further includes the plural semiconductor layers 30, the memory films 33, the insulators 40, and the connecting portions 50.

The plural semiconductor layers 30 penetrate each of the plural laminated electrodes 20 in the Z direction. The memory films 33 are provided between each of the plural semiconductor layers 30 and the laminated electrodes 20. The insulators 40 extend between adjoining pairs of the plural laminated electrodes 20. The connecting portions 50 are provided between the substrate 10 and the laminated electrodes 20. Each of the connecting portions 50 electrically connects one (semiconductor layer 30a) of the plural semiconductor layers 30 penetrating one of the corresponding adjoining pair of the laminated electrodes 20 with one (semiconductor layer 30b) of the plural semiconductor layer 30 penetrating the other of the corresponding adjoining pair of the laminated electrodes 20.

The ends of the semiconductor layers 30 on the substrate 10 side of the laminated electrodes 20 are positioned between the connecting portions 50 and the substrate 10. In this case, the substrate side ends of the semiconductor layers 30 may be positioned within the conductive layer 15, or the semiconductor layers 30 may penetrate the conductive layer 15.

Moreover, according to this embodiment, the ends of the insulators 40 on the substrate 10 side of the laminated electrodes 20 are also positioned between the connecting portions 50 and the substrate 10. In this case, the ends of the insulators 40 on the side of the substrate 10 may be positioned within the conductive layer 15, or the insulators 40 may partially divide the conductive layer 15 into parts.

No barrier layer (insulation layer 25) is provided between the conductive layer 15 and the laminated electrodes (see FIG. 1). For example, the insulation layer 23 is provided between the conductive layer 15 and the laminated electrodes 20. It is preferable that a barrier layer 73 is provided between the conductive layer 15 and the substrate 10.

The ends 21a of the word lines 21, the ends 35a of the selector gate electrodes 35, and the ends 15a of the conductive layer 15 as portions in contact with the insulators 40 contain a silicide. In this case, the ends of the conductive layers contacting the insulators 40 are silicided, wherefore the resistances of these ends is reduced.

A manufacturing method of the non-volatile memory device 300 is now explained with reference to FIGS. 16A through 21B. FIGS. 16A through 21B are cross-sectional views schematically illustrating the manufacturing steps of the non-volatile memory device 300 according to the third embodiment. In this embodiment, the same steps shown in the figures up to FIG. 11B performed for the non-volatile memory device 200 are carried out.

Figure 16A:
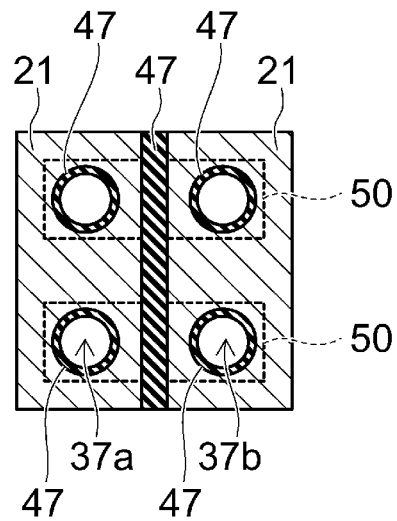
FIGS. 16A and 16B are cross-sectional views schematically illustrating manufacturing steps of the non-volatile memory device according to the third embodiment.
Figure 16B:
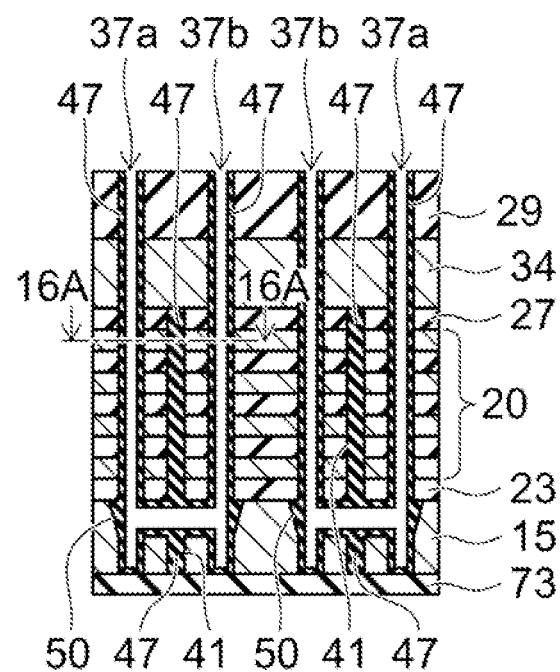

FIG. 16A illustrates a cross section taken along a line 16A-16A shown in FIG. 16B. FIG. 16B illustrates a cross section crossing the word lines 21 at right angles. These definitions of FIGS. 16A and 16B are applicable to FIGS. 17A through 19B and FIG. 20.

As illustrated in FIGS. 16A and 16B, sacrificial films 47 are formed on the inner surfaces of the memory holes 37a, the inner surfaces of the memory holes 37b, the inner surfaces of the grooves 51, and in the interiors of the slits 41. The sacrificial films 47 are silicon nitride films, for example.

As illustrated in FIG. 16A, the sacrificial films 47 cover the inner surfaces of the memory holes 37a and 37b. In addition, the sacrificial films 47 are so formed as to fill the interiors of the slits 41. More specifically, each of the sacrificial films 47 is so formed as to have a film thickness equal to or less than half of the width of each of the slits 41 in the X direction. It is preferable that the thickness of the respective sacrificial films 47 is so chosen as not to close the memory holes 37a and 37b.

As illustrated in FIG. 16B, the slits 41 formed between the grooves 51 and the barrier layer 73 are also filled by the sacrificial films 47.

Figure 17A:
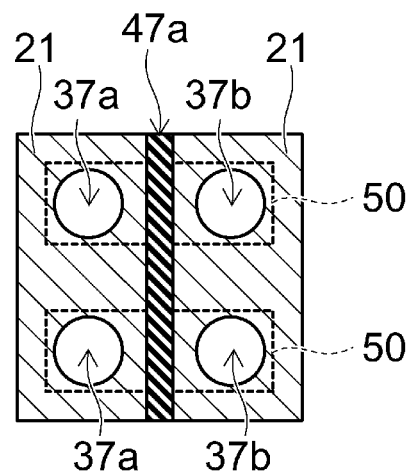
FIGS. 17A and 17B are cross-sectional views schematically illustrating manufacturing steps continuing from FIG. 16B.
Figure 17B:
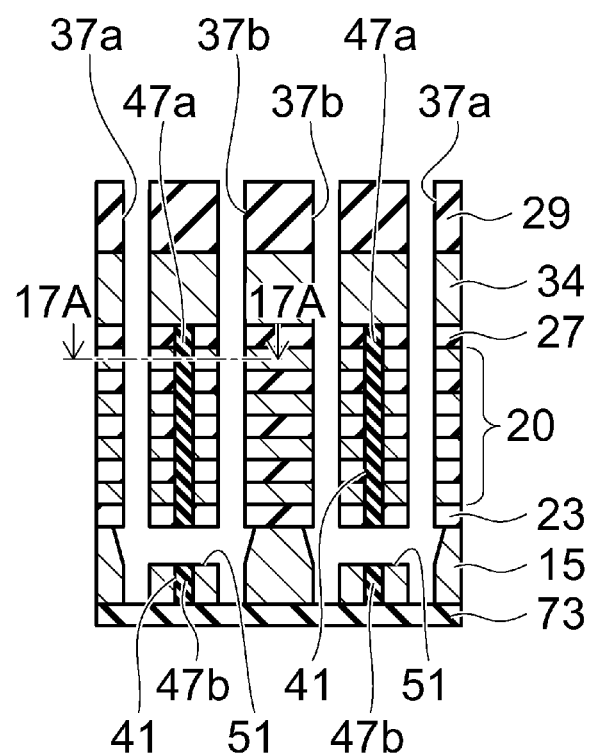

After the structures shown in FIGS. 16A and 16B are formed, the sacrificial films 47 formed on the inner surfaces of the memory holes 37a, the inner surfaces of the memory holes 37b, and the inner surfaces of the grooves 51 are removed as is shown in FIGS. 17A and 17B. For example, the sacrificial films 47 are removed by adopting isotropic dry-etching conditions in the area other than parts 47a filling the slits 41.

Figure 18A:
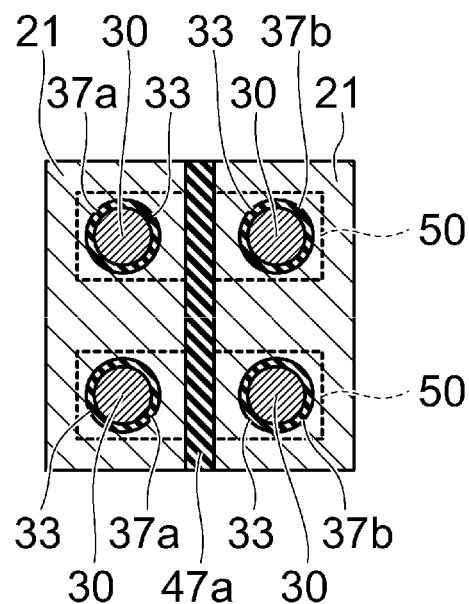
FIGS. 18A and 18B are cross-sectional views schematically illustrating manufacturing steps continuing from FIG. 17B.
Figure 18B:
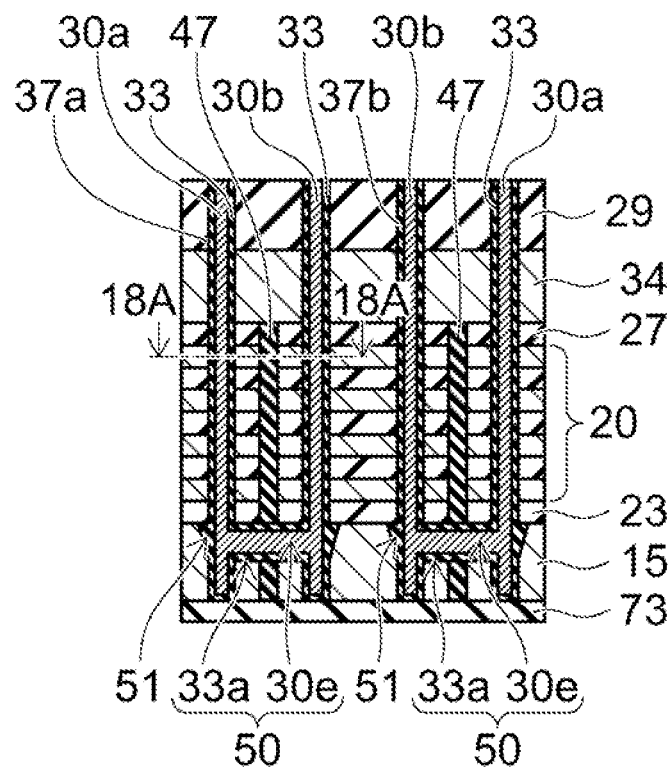

After the structure shown in FIGS. 17A and 17B is formed, the memory films 33 and the semiconductor layers 30 are formed on the inner surfaces of the memory holes 37a, the inner surfaces of the memory holes 37b, and the inner surfaces of the grooves 51 as illustrated in FIGS. 18A and 18B.

As illustrated in FIG. 18A, the memory films 33 cover the inner surfaces of the memory holes 37a and 37b. The semiconductor layers 30 may completely fill the interiors of the memory holes 37a and 37b, or may surround a hollow cavity at the center of each.

As illustrated in FIG. 18B, the memory films 33a as a part of the memory films 33 are formed on the inner surfaces of the grooves 51. Moreover, the cores 30c of the connecting portions 50 are formed in the interiors of the grooves 51. The cores 30c are formed simultaneously with formation of the semiconductor layers 30a and 30b, and contain polycrystalline silicon, for example. The cores 30c may have structure filling the interiors of the grooves 51, or may enclose a hollow cavity therein. On the other hand, the interiors of the slits 41 are filled by the sacrificial films 47 and the semiconductor layers 30 are not formed therein.

Figure 19A:
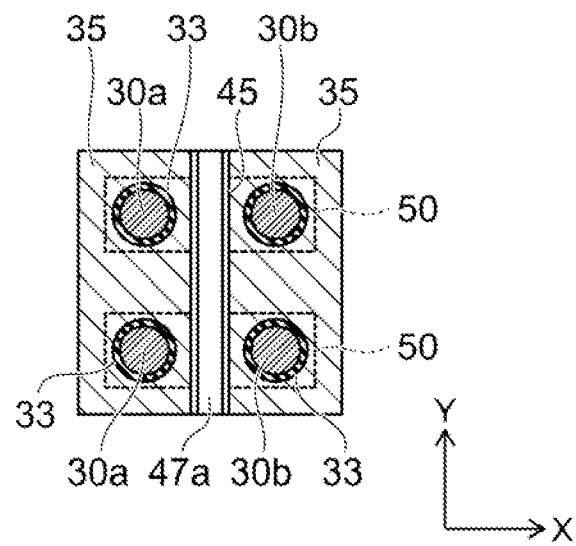
FIGS. 19A and 19B are cross-sectional views schematically illustrating manufacturing steps continuing from FIG. 18B.
Figure 19B:
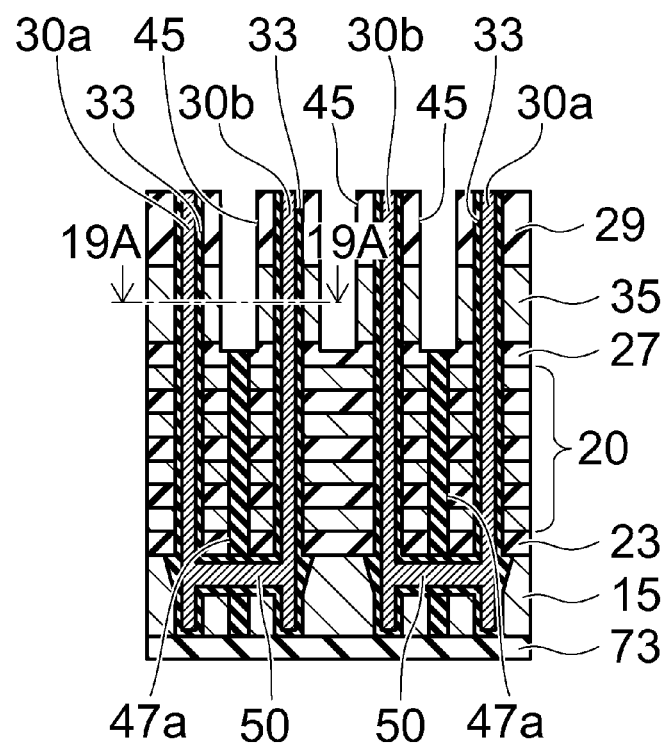

After the structure shown in FIGS. 18A and 18B is formed, the grooves 45 are formed to divide the conductive layer 34 formed on the laminated electrodes 20 into isolated parts as illustrated in FIGS. 19A and 19B. As illustrated in FIG. 19A, the grooves 45 extend in the Y direction, and divide the conductive layer 34 into the selector gate electrodes 35 in the shape of stripes.

As illustrated in FIG. 19B, the grooves 45 are formed between the semiconductor layers 30a and the semiconductor layers 30b, and between adjoining pairs of the semiconductor layers 30b. The grooves 45 communicate with the sacrificial films 47a in the spaces between the semiconductor layers 30a and the semiconductor layers 30b.

Figure 20:
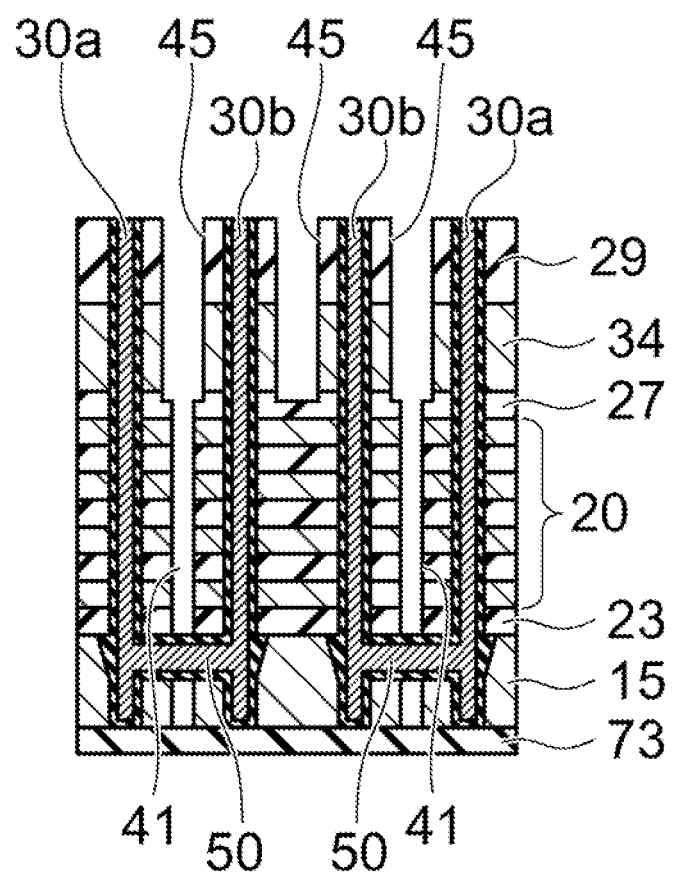
FIG. 20 is a cross-sectional view schematically illustrating manufacturing steps continuing from FIG. 19B.

After the structure of FIGS. 19A and 19B is formed, the sacrificial films 47a are selectively removed through the grooves 45 to reproduce the slits 41 as illustrated in FIG. 20. The sacrificial films 47a are silicon nitride films, for example, and allow selective etching with respect to the word lines 21, the selector gate electrodes 35, and the insulation layers 23 and 29. In other words, selective etching of the sacrificial films 47a is provided.

Figure 21A:
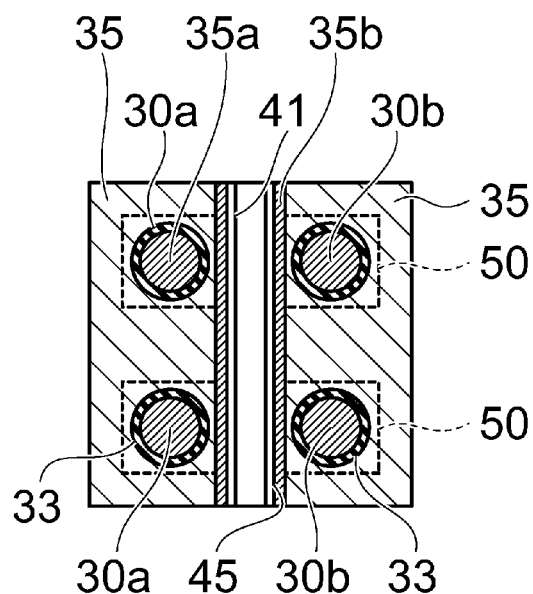
FIGS. 21A and 21B are cross-sectional views schematically illustrating manufacturing steps continuing from FIG. 20.
Figure 21B:
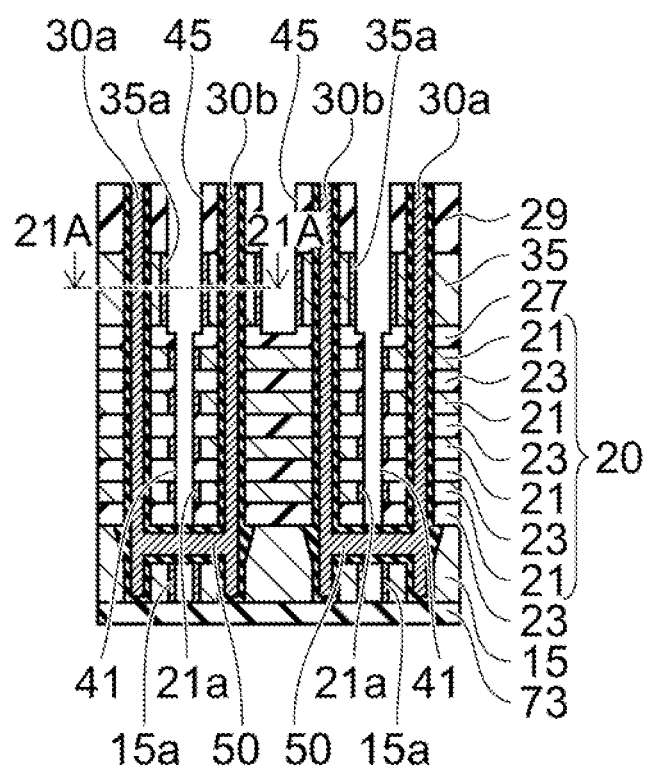

After the step resulting in the structure shown in FIG. 20, the ends 35a of the selector gate electrodes 35 exposed to the inner surfaces of the grooves 45, and the ends 21a of the word lines 21 exposed to the inner surfaces of the slits 41 are silicided as illustrated in FIGS. 21A and 21B. For example, metal films such as nickel (Ni) films and cobalt (Co) films are formed on the inner surfaces of the grooves 45 and the inner surfaces of the slits 41 by using CVD. Then, the laminated body as shown in FIG. 21B is heated to make the ends 15a of the conductive layers 15, the ends 21a of the word lines 21, and the ends 35a of the selector gate electrodes 35 into a metal silicide. Subsequently, the metal films formed at the ends of the insulation layers 27 and 29 exposed to the inner surfaces of the grooves 45, and of the insulation layers 23 and 25 exposed to the inner surfaces of the slits 41 are removed.

After removal of the metal films, the insulators 40 are formed inside the slits 41 and the grooves 45. The insulators 40 are formed by silicon oxide films, for example. The wiring layer 60 is further formed on the insulation layer 29 to electrically connect the semiconductor layers 30a with the bit lines 61, and electrically connect the semiconductor layers 30b with the source lines 63. This step completes the manufacture of the non-volatile memory device 300.

According to this embodiment, no barrier layer is provided between the conductive layer 15 and the laminated electrodes 20. Therefore, the memory holes 37 are easily formed. Moreover, the sacrificial films 47a are embedded in the slits 41 from the grooves 51 formed for producing the connecting portions 50. Accordingly, the connecting portions 50 are not divided, and the sizes of the memory holes 37 are equalized. Furthermore, the sacrificial films 47a are removed through the grooves 45 dividing the conductive layer 34, and the ends of the word lines 21 and the selector gate electrodes 35 are a metal silicide. According to the non-volatile memory device 300, therefore, the sizes of the memory holes are uniform, and the resistances of the conductive layer 15 (back gate), the word lines 21, and the selector gate electrodes 35 decrease. Accordingly, the device characteristics improve.

Fourth Embodiment

Figure 22:
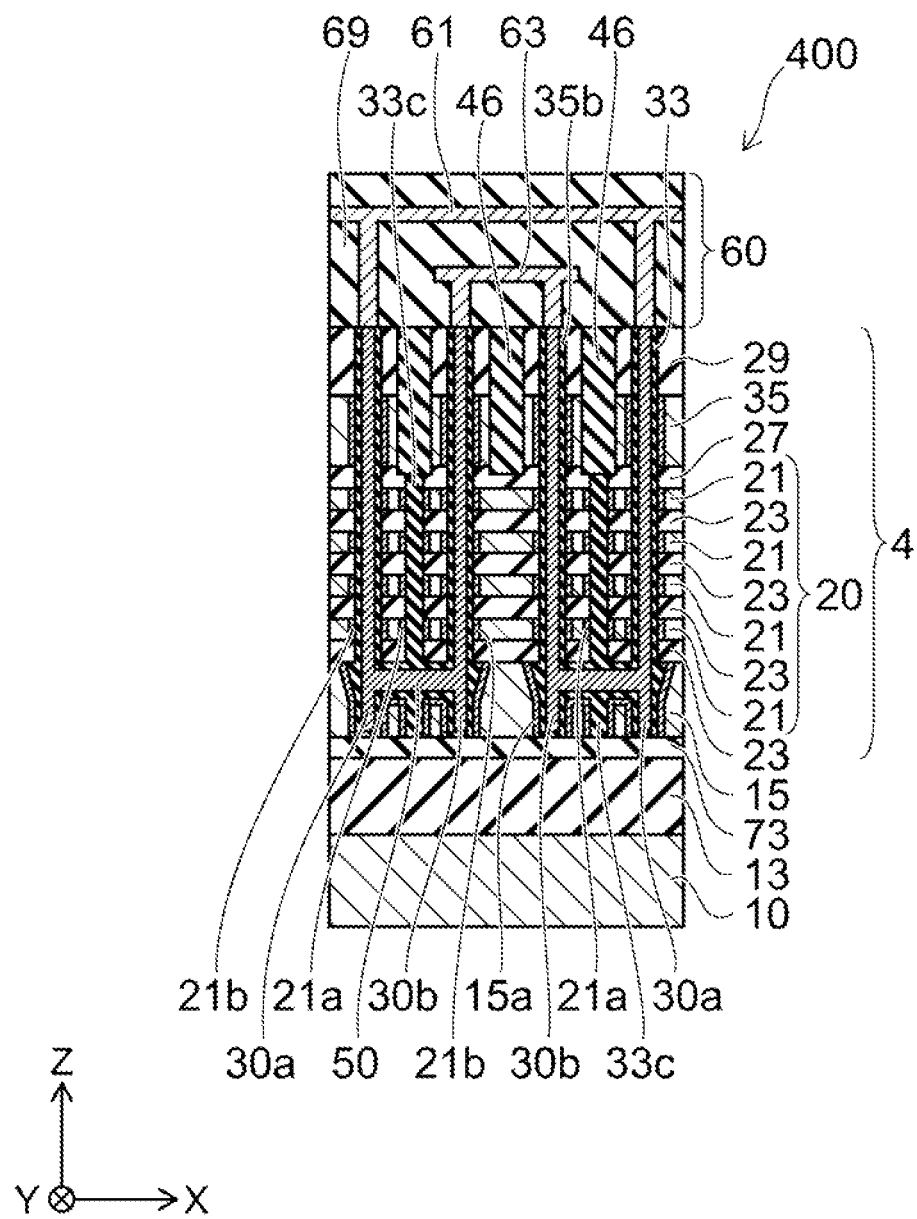
FIG. 22 is a cross-sectional view schematically illustrating a non-volatile memory device according to a fourth embodiment.

FIG. 22 is a cross-sectional view schematically illustrating a non-volatile memory device 400 according to a fourth embodiment. The non-volatile memory device 400 includes a memory cell array 4 having three-dimensional constitution. FIG. 22 shows a cross section of the memory cell array 4 crossing the word line 21 at right angles.

As illustrated in FIG. 22, the memory cell array 4 includes the conductive layer 15 provided on the substrate 10 and the plural laminated electrodes 20 provided on the conductive layer 15. Each of the laminated electrodes 20 includes the plural word lines 21 laminated in the Z direction, and the insulation layers 23 provided between the respective word lines 21.

The substrate 10 is a silicon substrate, for example. The conductive layer 15 is provided on the substrate 10 via the interlayer insulation film 13, for example. The substrate 10 may include a peripheral circuit for driving the memory cell array 4, for example.

The memory cell array 4 further includes the plural semiconductor layers 30, the memory films 30, the insulators (memory films 33c), and the connecting portions 50.

The plural semiconductor layers 30 penetrate each of the plural laminated electrodes 20 in the Z direction. The memory films 33 are provided between each of the plural semiconductor layers 30 and the laminated electrodes 20. The memory films 33c are provided between adjoining pairs of the plural laminated electrodes 20. The connecting portions 50 are provided between the substrate 10 and the laminated electrodes 20. Each of the connecting portions 50 electrically connects one (semiconductor layer 30a) of the plural semiconductor layers 30 penetrating one of the corresponding adjoining pair of the laminated electrodes 20 with one (semiconductor layer 30b) of the plural semiconductor layer 30 penetrating the other of the corresponding adjoining pair of the laminated electrodes 20.

The ends of the semiconductor layers 30 on the substrate 10 side of the laminated electrodes 20 are positioned between the connecting portions 50 and the substrate 10. In this case, the substrate ends of the semiconductor layers 30 may be positioned within the conductive layer 15, or the semiconductor layers 30 may penetrate the conductive layer 15.

Moreover, according to this embodiment, the ends of the memory films 33c on the substrate 10 side of the laminated electrodes are also positioned between the connecting portions 50 and the substrate 10. In this case, the substrate side ends of the memory films 33c may be positioned within the conductive layer 15, or the memory films 33c may partially divide the conductive layer 15 into parts.

No barrier layer (insulation layer 25) is provided between the conductive layer 15 and the laminated electrodes 20 (see FIG. 1). For example, the insulation layer 23 is provided between the conductive layer 15 and the laminated electrodes 20. It is preferable that the barrier layer 73 is provided between the conductive layer 15 and the substrate 10.

According to this embodiment, the ends 21a of the word lines 21 and the ends 15a of the conductive layer 15 as portions in contact with the memory films 33c contain a metal silicide. Similarly, ends 21b of the word lines 21 and ends 35b of the selector gate electrodes 35 as portions in contact with the memory films 33 also contain a metal silicide. According to this embodiment, therefore, the ends of the conductive layers facing to the semiconductor layers 30 via the memory films 33 are also made into a silicide, wherefore the resistances of these ends is decreased.

A manufacturing method of the non-volatile memory device 400 is now explained with reference to FIGS. 23 through 25B. FIGS. 23 through 25B are cross-sectional views schematically illustrating the manufacturing steps of the non-volatile memory device 400 according to the fourth embodiment. In this embodiment, the same steps shown in the figures up to FIG. 11B performed for the non-volatile memory device 200 are carried out.

Figure 23:
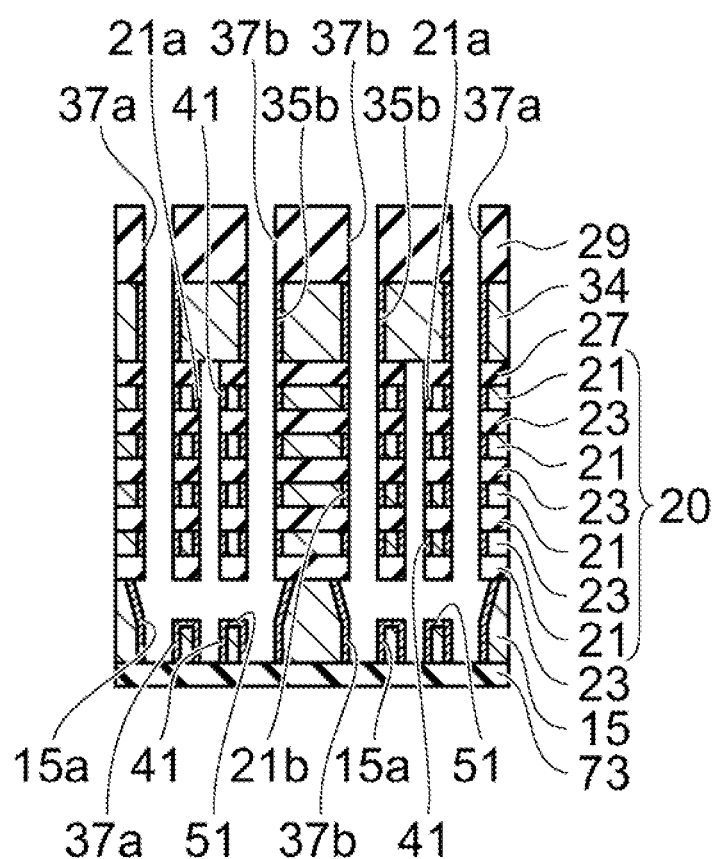
FIG. 23 is a cross-sectional view schematically illustrating manufacturing steps of the non-volatile memory device according to the fourth embodiment.

FIG. 23 illustrates a cross section crossing the word lines 21 at right angles. As illustrated in this figure, the respective ends of the conductive layer 15, the word lines 21, and the conductive layer 34 exposed to the inner surfaces of the memory holes 37, the slits 41, and the groves 51 are made into a metal silicide.

For example, metal films such as nickel (Ni) films and cobalt (Co) films are formed on the inner surfaces of the memory holes 37, the inner surfaces of the slits 41, and the inner surfaces of the grooves 51 through the memory holes 37. Then, the laminated body is heated to make the end 15a of the conductive layer 15, the ends 21a and 21b of the word lines 21, and the ends 35b of the conductive layer 34 into a metal silicide.

Figure 24A:
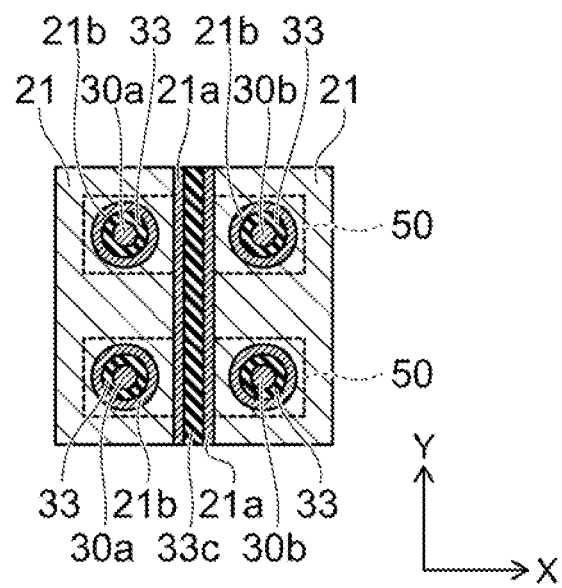
FIGS. 24A and 24B are cross-sectional views schematically illustrating manufacturing steps continuing from FIG. 23.
Figure 24B:
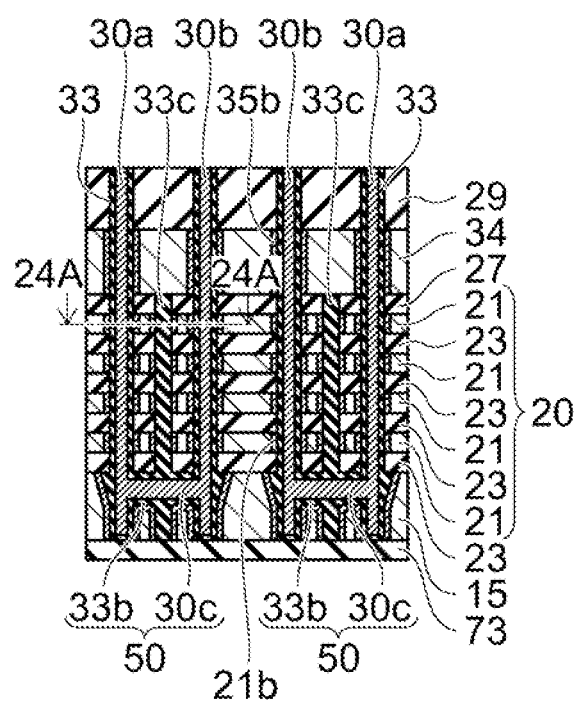

After the step in FIG. 23, the memory films 33 and the semiconductor layers 30 are formed on the inner surfaces of the memory holes 37 and the inner surfaces of the grooves 51 as illustrated in FIGS. 24A and 24B. Also, the memory films 33c are embedded in the slits 41.

FIG. 24A illustrates a cross section taken along a line 24A-24A shown in FIG. 24B. FIG. 24B illustrates a cross section crossing the word lines 21 at right angles. These definitions of the figures are applicable to FIGS. 25A and 25B.

As illustrated in FIG. 24A, the memory films 33 cover the respective inner surfaces of the memory holes 37a and 37b. The memory films 33 contact the ends 21b of the word lines 21 made into a metal silicide.

The slits 41 are filled with the memory films 33c as a part of the memory films 33. The width of each of the slits 41 in the X direction is less than or equal to a length twice the film thickness of each of the memory films 33c. The memory films 33c contact the ends 21a of the word lines 21 as portions made into a metal silicide.

As illustrated inn FIG. 24B, the semiconductor layers 30 fill the interiors of the memory holes 37. The semiconductor layers 30 may completely close the interiors of the memory holes 37, or may have hollow cavity at the center of each.

The memory films 33a as a part of the memory films 33 are formed on the inner surfaces of the grooves 51. Moreover, the cores 30c of the connecting portions 50 are formed in the interiors of the grooves 51. The cores 30c are formed simultaneously with formation of the semiconductor layers 30a and 30b, and contain polycrystalline silicon, for example. The cores 30c may have structure filling the interiors of the grooves 51, or may have a hollow cavity therein. On the other hand, the interiors of the slits 41 are closed by the memory films 33c and the semiconductor layers are not formed therein.

Figure 25A:
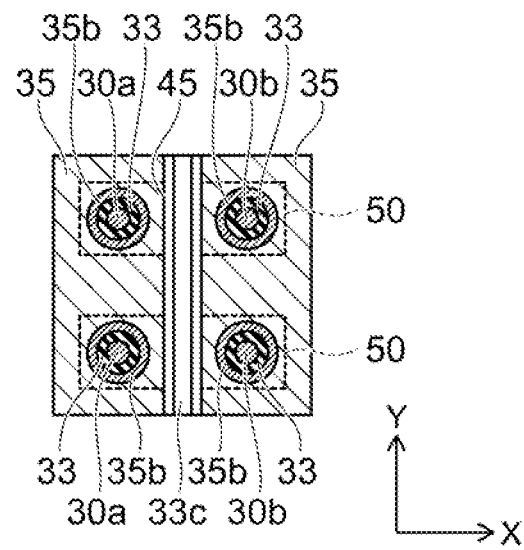
FIGS. 25A and 25B are cross-sectional views schematically illustrating manufacturing steps continuing from FIG. 24B.
Figure 25B:
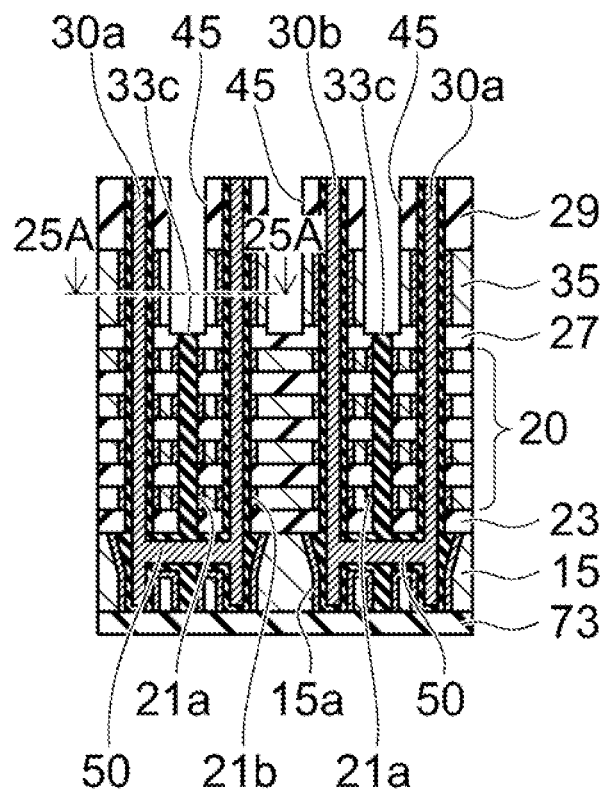

After the structure shown in FIGS. 24A and 24B is formed, the grooves 45 are formed to divide the conductive layer 34 formed on the laminated electrodes 20 into parts as illustrated in FIGS. 25A and 25B. The grooves 45 extend in the Y direction, and divide the conductive layer 34 into the selector gate electrodes 35 in the shape of strips. The grooves 45 communicate with the memory films 33c in the spaces between the semiconductor layers 30a and the semiconductor layers 30b.

Then, the insulators 46 are formed inside the grooves 45, and the wiring layer 60 is formed on the insulation layer 29. This step completes the manufacture of the non-volatile memory device 400.

According to this embodiment, no barrier layer is provided between the conductive layer 15 and the laminated electrodes 20 similarly to the above embodiment. Accordingly, the memory holes 37 are easily produced. Moreover, the memory films 33c are embedded in the slits 41 through the grooves 51 formed for producing the connecting portions 50. Accordingly, the connecting portions 50 are not divided, and the sizes of the memory holes 37 are equalized. Furthermore, the respective ends of the conductive layer 15, the word lines 21, and the conductive layer 34 as portions exposed to the inner surfaces of the memory holes 37, the slits 41, and the grooves 51 are made into a silicide. In addition, the step of removing the sacrificial films 47 required in the manufacturing method of the third embodiment is eliminated in this embodiment. Accordingly, the manufacturing method is further simplified.

According to the non-volatile memory device 400, therefore, the sizes of the memory holes are equalized, and the resistances of the conductive layer 15 (back gate), the word lines 21, and the selector gate electrodes 35 are decreased. Accordingly, the device characteristics improve.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile memory device, comprising:
a base layer;
a first stacked unit and a second stacked unit disposed above the base layer and arranged in parallel to each other and spaced apart from each other in a first direction, in a plane parallel to the base layer, each of the first stacked unit and the second stacked unit including a plurality of electrodes stacked above the base layer and extending in a second direction perpendicular to the first direction;

a first semiconductor layer penetrating the first stacked unit in a third direction perpendicular to the first direction and the second direction;

a second semiconductor layer penetrating the second stacked unit in the third direction;

a first memory film disposed between the first semiconductor layer and the first stacked unit;

a second memory film disposed between the second semiconductor layer and the second stacked unit;

an insulator disposed between the first stacked unit and the second stacked unit; and a connecting portion disposed between the base layer and the first stacked unit and between the base layer and the second stacked unit, the connecting portion electrically connecting the first semiconductor layer and the second semiconductor layer, wherein an end portion of the first semiconductor layer is positioned between the connecting portion and the base layer.

2. The device according to claim 1, wherein
an end portion of the insulator is positioned between the connecting portions and the base layer.

3. The device according to claim 1, wherein
an end portion of the second semiconductor layer is positioned between the connecting portion and the base layer.

4. The device according to claim 1, wherein
a width of the insulator in the first direction is less than or equal to two times a thickness of the first memory film.

5. The device according to claim 1, wherein
the insulator includes a same material as a material of the first memory film.

6. The device according to claim 1, further comprising:
a conductive layer disposed between the base layer and the first stacked unit and between the base layer and the second stacked unit, the conductive layer covering the connecting portion via an insulating layer; and
a barrier layer disposed between the conductive layer and the base layer.

7. The device according to claim 6, wherein
an end portion of the first semiconductor layer contacts the barrier layer via the insulating layer.

8. The device according to claim 6, wherein
an end portion of the insulator contacts the barrier layer.

9. The device according to claim 6, wherein
an end portion of the first semiconductor layer contacts the barrier layer via the insulating layer, and
an end portion of the second semiconductor layer contacts the barrier layer via the insulating layer.

10. The device according to claim 9, wherein
an end portion of the insulator contacts the barrier layer.

11. The device according to claim 6, wherein
the insulating layer is formed of a same material as a material of the first memory film.

12. The device according to claim 6, wherein
the barrier layer provides selective etching with respect to the conductive layer.

13. The device according to claim 6, wherein
the barrier layer includes an oxide of metal.

14. The device according to claim 1, wherein
each of the plurality of electrodes includes a metal silicide portion at a side of the insulator.

15. The device according to claim 1, wherein
each of the plurality of electrodes includes a metal silicide portion at a side of the first memory film.

* * * * *